US012750161B2

(12) United States Patent
Choi et al.

(10) Patent No.: US 12,750,161 B2
(45) Date of Patent: Sep. 29, 2026

(54) APPARATUS FOR TRANSMITTING AND RECEIVING SIGNAL

(71) Applicant: Samsung Electronics Co., Ltd., Suwon-si (KR)

(72) Inventors: Soonwoo Choi, Suwon-si (KR); Minki Ahn, Suwon-si (KR); Junyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 304 days.

(21) Appl. No.: 18/661,632

(22) Filed: May 12, 2024

(65) Prior Publication Data

US 2024/0421935 A1 Dec. 19, 2024

(30) Foreign Application Priority Data

Jun. 19, 2023 (KR) ........................ 10-2023-0078203
Sep. 14, 2023 (KR) ........................ 10-2023-0122746

(51) Int. Cl.
*H04L 1/00* (2006.01)
*H03M 13/39* (2006.01)
(Continued)

(52) U.S. Cl.
CPC ...... *H04L 1/0045* (2013.01); *H03M 13/3927* (2013.01); *H04L 25/0258* (2013.01); *H04L 27/38* (2013.01)

(58) Field of Classification Search
CPC ... H04L 1/0045; H04L 25/0258; H04L 27/38; H04L 25/067; H03M 13/3927
(Continued)

(56) References Cited

U.S. PATENT DOCUMENTS 6,907,084 B2 6/2005 Jeong
7,313,750 B1 * 12/2007 Feng .................... H04L 1/0054 714/795
(Continued)

FOREIGN PATENT DOCUMENTS

CN 115987745 A 4/2023
GB 2548876 A * 10/2017 ............ H04L 27/38
(Continued)

OTHER PUBLICATIONS

Jucuan Mao, Eur. Conf. Netw. Commun. (EuCNC), Jun. 2016, pp. 16-21.
(Continued)

*Primary Examiner* — Mahendra R Patel
(74) *Attorney, Agent, or Firm* — Muir Patent Law, PLLC

(57) ABSTRACT

An apparatus for transmitting and receiving signal may include a transceiver configured to receive a reception signal through a channel and demodulate the reception signal into a reception symbol and a channel estimation value corresponding to the reception signal, and a demapper configured to detect a modulation type of the reception signal, calculate a first status data based on a first value obtained by zero-forcing the reception symbol and a second value obtained by squaring the channel estimation value, calculate a second status data based on the second value, and estimate bit information with respect to the reception symbol based on the modulation type, the first status data, and the second status data.

18 Claims, 11 Drawing Sheets

(51) Int. Cl.
*H04L 25/02* (2006.01)
*H04L 27/38* (2006.01)

(58) Field of Classification Search
USPC .......................................................... 370/329
See application file for complete search history.

(56) References Cited

U.S. PATENT DOCUMENTS 7,636,401 B2 * 12/2009 Hammerschmidt ... H04B 1/406 375/267
7,860,194 B2 * 12/2010 Kim ...................... H04L 1/0075 714/780
8,693,588 B2 * 4/2014 McCloud .......... H04L 25/03242 375/341
9,819,528 B2 11/2017 El-Hajjar et al.
10,616,032 B2 4/2020 Reuven et al.
2003/0007581 A1 * 1/2003 Agazzi ........... G01R 31/318502 375/341
2007/0058756 A1 * 3/2007 Mahadevappa ....... H04L 25/067 375/340
2010/0135375 A1 * 6/2010 Lee ................... H04L 25/03019 375/231
2010/0150268 A1 * 6/2010 Sasaki ..................... H04L 27/38 375/298
2014/0153628 A1 * 6/2014 Vojcic ................ H03M 13/1108 375/227
2017/0317788 A1 * 11/2017 Chang ................... H04L 1/0054
2020/0067758 A1 * 2/2020 Reuven ................ H04B 7/0413
2022/0385518 A1 12/2022 Xin et al.

FOREIGN PATENT DOCUMENTS

JP 6470339 B2 2/2019
KR 10-2094736 B1 3/2020

OTHER PUBLICATIONS

Umut, Euromicro Systems. Digit. Syst. Design (DSD), Aug./Sep. 2004, pp. 249-253.
Patrick Robertson, IEEE Int. Conf. Commun., Seattle, WA, USA, Jun. 1995, pp. 1009-1013.
LLR Metrics, IEEE Latincom, Nov. 2021, pp. 1-6.
Jianxiao Yang, EEE SIPS, Hangzhou, China, Oct. 2015, pp. 1-6.
IEEE Standard P802.11, 2022.
Qi Wang, IEEE Trans. Veh. Technol., vol. 63, No. 1, pp. 119-130, Jan. 2014.
Chia Wei, IEEE Trans. Wireless Commun., vol. 5, No. 10, pp. 2742-2751, Oct. 2006.

* cited by examiner

500

APPARATUS FOR TRANSMITTING AND RECEIVING SIGNAL

CROSS-REFERENCE TO RELATED APPLICATIONS

This application claims priority to and the benefit of Korean Patent Application No. 10-2023-0078203 filed on Jun. 19, 2023, and Korean Patent Application No. 10-2023-0122746 filed on Sep. 14, 2023, in the Korean Intellectual Property Office, the disclosure of each of which is incorporated herein by reference in its entirety.

BACKGROUND

(a) Field

The present disclosure relates to an apparatus for transmitting and receiving signal.

(b) Description of the Related Art

To support augmented reality (AR) and virtual reality (VR) that require high throughput, the WiFi standard is evolving from 802.11ax (WiFi 6) to 802.11be extremely high throughput (EHT). According to evolving to 802.11be EHT (WiFi 7), the bandwidth is up to 320 MHz, and the constellation points have increased to 4096-QAM (Quadrature Amplitude Modulation), which is 1.2 times higher than the existing 1024-QAM. Therefore, in order to support the new WiFi standard, from a hardware perspective, higher frequency, higher complexity, and higher power consumption are required than conventional hardware structures.

SUMMARY

The present disclosure attempts to provide an apparatus for transmitting and receiving signal including a demapper having a simplified structure.

An apparatus for transmitting and receiving signal may include a transceiver configured to receive a reception signal through a channel and demodulate the reception signal into a reception symbol and a channel estimation value corresponding to the reception signal, and a demapper configured to detect a modulation type of the reception signal, calculate a first status data based on a first value obtained by zero-forcing the reception symbol and a second value obtained by squaring the channel estimation value, calculate a second status data based on the second value, and estimate bit information with respect to the reception symbol based on the modulation type, the first status data, and the second status data.

An operation method of an apparatus for transmitting and receiving signal may include receiving a reception signal through a channel and demodulating the reception signal into a reception symbol and a channel estimation value corresponding to the reception signal, detecting a modulation type of the reception signal, calculating a first status data based on a first value obtained by zero-forcing the reception symbol and a second value obtained by squaring the channel estimation value, calculating a second status data based on the second value, estimating bit information with respect to the reception symbol based on the modulation type, the first status data, and the second status data, and performing decryption on the bit information.

An apparatus for transmitting and receiving signal may include a transceiver configured to receive a reception signal through a channel and demodulate the reception signal into a reception symbol and a channel estimation value corresponding to the reception signal, a status data calculator configured to detect a modulation type of the signal, calculate a first status data based on a first value obtained by zero-forcing the reception symbol and a second value obtained by squaring the channel estimation value, and calculate a second status data based on the second value, an LLR calculator configured to estimate a log likelihood ratio (LLR) signal of n bits including a plurality of first bits representing a real part and a plurality of second bits representing an imaginary part with respect to the reception symbol based on the modulation type, the first status data, and the second status data, and a lookup table storing a mapping relationship between the reception symbol and the plurality of first bits or the plurality of second bits depending on the modulation type.

DETAILED DESCRIPTION OF THE EMBODIMENTS

Figure 1:
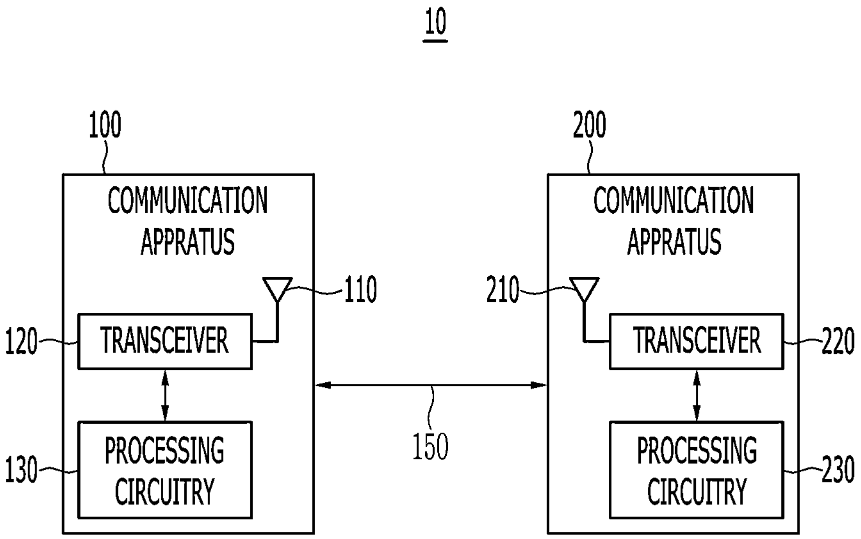
FIG. 1 is a block diagram showing a communication system according to an embodiment.

Hereinafter, with reference to the accompanying drawings, embodiments of the present invention will be described in detail so that those skilled in the art can easily carry out the present invention. As those skilled in the art would realize, the described embodiments may be modified in various different ways, and the present disclosure is not limited to the embodiments described herein.

Accordingly, the drawings and description are to be regarded as illustrative in nature and not restrictive. Like reference numerals designate like elements throughout the specification. In the flowchart described with reference to the drawings, the order of operations may be changed, several operations may be merged, a certain operation may be divided, and a specific operation may not be performed.

In addition, expressions described in the singular may be interpreted in the singular or plural unless explicit expressions such as "one" or "single" are used. Terms including ordinal numbers, such as first and second, may be used to describe various components, but the components are not limited by these terms. These terms may be used for the purpose of distinguishing one component from another.

Figure 2:
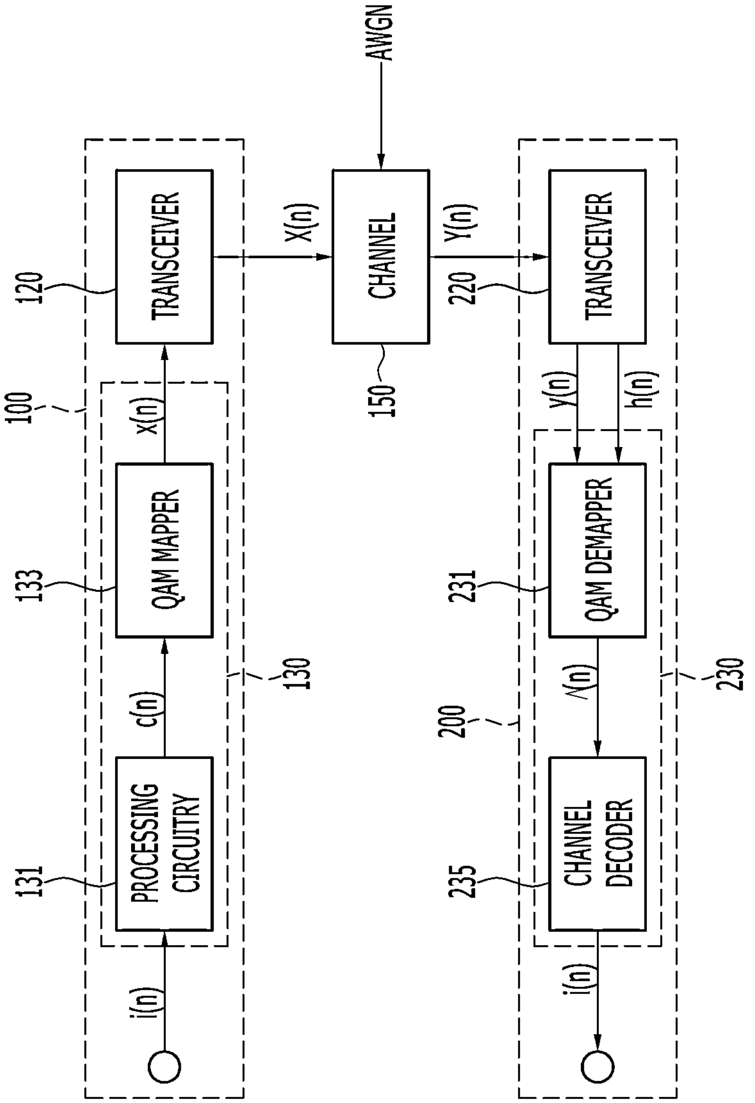
FIG. 2 is a block diagram specifically showing a communication system according to an embodiment.

FIG. 1 is a block diagram showing a communication system according to an embodiment. FIG. 2 is a block diagram specifically showing a communication system according to an embodiment.

As shown in FIG. 1, a communication system 10 may include a first wireless communication device 100 and a second wireless communication device 200. Each of the first wireless communication device 100 and the second wireless communication device 200 may be any device enabled to communicate in the communication system 10. In an embodiment, the first wireless communication device 100 and the second wireless communication device 200 may communicate with each other through a channel 150. For example, the channel 150 may include radio band or frequency band. In an embodiment, each of the first wireless communication device 100 and the second wireless communication device 200 may be an access point or station of a wireless local-area network (WLAN) system.

The first wireless communication device 100 may include an antenna 110, a transceiver 120, and a processing circuit 130. In an embodiment, the antenna 110, the transceiver 120, and the processing circuit 130 may be included in one package, and may also be included in different packages, respectively.

The antenna 110 may receive a signal from the second wireless communication device 200 and provide it to the transceiver 120, and may transmit a signal provided from the transceiver 120 to the second wireless communication device 200. In an embodiment, the antenna 110 may include a plurality of antennas for multiple-input multiple-output (MIMO). In an embodiment, the antenna 110 may include a phased array for beamforming.

The transceiver 120 may process a signal received from the second wireless communication device 200 through the antenna 110, and may provide the processed signal to the processing circuit 130. The transceiver 120 may process a signal provided from the processing circuit 130, and may output the processed signal through the antenna 110. In some embodiments, the transceiver 120 may include an analog circuit such as a low noise amplifier, a mixer, a filter, a power amplifier, and an oscillator. In some embodiments, the transceiver 120 may process a signal received from the antenna 110 and/or a signal received from the processing circuit 130 based on the control of the processing circuit 130.

The processing circuit 130 may extract information transmitted by the first wireless communication device 100 by processing a signal received from the transceiver 120. For example, the processing circuit 130 may extract information by demodulating and/or decoding the signal received from the transceiver 120. In addition, a signal including information to be transmitted to the second wireless communication device 200 may be generated and provided to the transceiver 120.

Referring also to FIG. 2, the processing circuit 130 may include a channel encoder 131 and a mapper (e.g., QAM mapper) 133.

The processing circuit 130 may provide a signal generated by encoding and/or modulating data to be transmitted to the second wireless communication device 200 to the transceiver 120. For example, the channel encoder 131 may generate a series of symbol data c(n) by encoding a transmitted data i(n). The channel encoder 131 may transfer the generated symbol data c(n) to the mapper 133. Herein, n may be an integer of 1 or more.

The mapper 133 may map the symbol data c (n) into one point in signal constellation through division of blocks, and may convert the symbol data c(n) into a modulation symbol x(n) of a complex number value.

The transceiver 120 may generate a transmission signal X(n) by a code division multiple access (CDMA) method or an orthogonal frequency division multiplex (OFDM) method with respect to the modulation symbol x(n). The transceiver 120 may transmit the transmission signal X(n) to the second wireless communication device 200 through the channel 150.

In an embodiment, the processing circuit 130 may include a programmable component such as a central processing unit (CPU) and a digital signal processor (DSP), may include a reconfigurable component such as a field programmable gate array (FPGA), and may include a component providing a fixed function such as an IP (intellectual property) core. In an embodiment, the processing circuit 130 may include or access a memory storing data and/or a series of instructions.

Meanwhile, the transmission signal X(n) transmitted by the transceiver 120 may be distorted due to noise and fading of the channel 150 while passing through the channel 150. The channel 150 may receive the transmission signal X(n), and output a reception signal Y(n).

Referring back to FIG. 1, the second wireless communication device 200 may include an antenna 210, a transceiver 220, and a processing circuit 230.

The antenna 210 may receive a signal from the first wireless communication device 100 and provide the received signal to the transceiver 220, and may transmit a signal provided from the transceiver 220 to the first wireless communication device 100.

The transceiver 220 may process a signal received from the first wireless communication device 100 through the antenna 210, and may provide the processed signal to the processing circuit 230. The transceiver 220 may process a signal provided from the processing circuit 230, and may output the processed signal through the antenna 210. In some embodiments, the transceiver 220 may include an analog circuit such as a low noise amplifier, a mixer, a filter, a power amplifier, and an oscillator. In some embodiments, the transceiver 220 may process a signal received from the antenna 210 and/or a signal received from the processing circuit 230 based on the control of the processing circuit 230.

The transceiver 220 may perform baseband demodulation and channel estimation on the reception signal. For example, the transceiver 220 may be a CDMA rake receiver or an OFDM demodulator consisting of an inverse fast Fourier transform (IFFT) and a channel estimator.

The transceiver 220 may obtain a channel estimation value h(n) and a reception symbol y(n) modulated with QAM or phase shift keying (PSK) by demodulating the reception signal Y (n). The reception signal Y (n) may be in the time domain or the frequency domain. Meanwhile, Wi-Fi packets may be divided into two parts of a preamble part and a data part. The preamble part may start with a legacy-long training field (LLTF), which provides estimation. A Wi-Fi packet may sequentially include the data part and the preamble part. The transceiver 220 may process the reception signal Y(n) in order to correct a carrier frequency offset, and may obtain the reception symbol y(n) starting from a first sample of a valid detected Wi-Fi preamble. The transceiver 220 may remove a cyclic prefix (CP) with respect to each OFDM symbol. In addition, the transceiver 220 may obtain the estimation value h (n) with respect to the channel experienced by the reception signal Y(n).

The transceiver 220 may obtain the channel estimation value h(n) at every preset period.

Furthermore, before performing the baseband demodulation, the transceiver 220 may perform filtering, low noise amplification (LNA), and the like, with respect to the reception signal Y(n) input through the antenna 210.

The processing circuit 230 may extract information transmitted by the first wireless communication device 100 by processing the reception symbol y(n) and the channel estimation value h(n) transferred from the transceiver 220. Referring also to FIG. 2, the processing circuit 230 may include a demapper (e.g., QAM demapper) 231 and a channel decoder 235.

In addition, although not shown in FIG. 2, the processing circuit 230 may further includes multiple fast Fourier transform (FFT) unit. The FFT unit may perform Fourier transform on signal received through the channel 150 and transfer it to the demapper 231.

The demapper 231 may estimate bit information from the reception symbol y(n). Specifically, the demapper 231 may calculate soft metric, by using the reception symbol y(n) and the channel estimation value h(n). At this time, the soft metric may be reliability information for each bit for the bits forming the codeword of the channel code. Specifically, the demapper 231 may calculate the soft metric from the reception signal distorted while passing through the channel 150. The demapper 231 may calculate a sequence A(n), which is a soft metric value. The demapper 231 may transfer the calculated sequence A(n) to the channel decoder 235.

In an embodiment, the demapper 231 may receive the reception symbol (e.g., M-QAM symbol, $M=2^n$, n is an integer of 2 or more), and calculate a log likelihood ratio (LLR). The demapper 231 may remap the reception signal into an LLR soft bit signal of n bits (hereinafter, referred to as an LLR signal). The demapper 231 may transfer LLR signal to the channel decoder 235 as the sequence $\wedge$(n).

The channel decoder 235 may receive the sequence $\wedge$(n), and may perform decryption on the sequence $\wedge$(n) to generate the data i(n).

In an embodiment, the channel decoder 235 may be a decoder for binary convolutional code, a soft output viterbi algorithm (SOVA) iterative decoder for decoding of turbo codes, maximum posteriori (log-MAP) iterative decoder, a Max-log-MAP iterative decoder, a decoder using a belief propagation (BP) technique for decoding of low-density parity-check (LDPC) codes, and the like. Meanwhile, in the case of WiFi standard, the channel decoder 235 may use LDPC decoder. Since the channel decoder 235 performs decryption on the sequence $\wedge$(n) transferred from the demapper 231, performance of the channel decoder 235 may be based on reliability of the output value of the demapper 231. Accordingly, efficient design of the demapper configured to generate soft metrics of high reliability may be very important. At the same time, the complexity of the demapper must also be sufficiently considered. However, the maximum likelihood (ML)-based demapper (soft-output demapper, LLR demapper), which accurately reflects LLR, shows excellent performance but has high implementation complexity.

For example, the reception signal may be expressed as Equation 1 below.

$$Y(k) = X(k)H(k) + W(k) \quad \text{[Equation 1]}$$

Here, X(k) is a transmission signal value of a k-th subcarrier received from the transmitter. W(k) is additive white Gaussian noise (AWGN). H(k) is a channel response value of the k-th subcarrier.

Table 1 below shows information about the normalization factor A defined according to 4096-QAM and the bits used to express a real part and an imaginary part according to QAM. The normalization factor A may be a value that makes the average energy of the symbol to be 1.

TABLE 1

| QAM | A | Real part | Imaginary part |
|---|---|---|---|
| BPSK | 1 | $b_0$ | — |
| QPSK | $1/\sqrt{2}$ | $b_0$ | $b_1$ |
| 16-QAM | $1/\sqrt{10}$ | $b_0$, $b_1$ | $b_2$, $b_3$ |
| 64-QAM | $1/\sqrt{42}$ | $b_0$, $b_1$, $b_2$ | $b_3$, $b_4$, $b_5$ |
| 256-QAM | $1/\sqrt{170}$ | $b_0$, $b_1$, $b_2$, $b_3$ | $b_4$, $b_5$, $b_6$, $b_7$ |
| 1024-QAM | $1/\sqrt{682}$ | $b_0$, $b_1$, $b_2$, $b_3$, $b_4$ | $b_5$, $b_6$, $b_7$, $b_8$, $b_9$ |
| 4096-QAM | $1/\sqrt{2730}$ | $b_0$, $b_1$, $b_2$, $b_3$, $b_4$, $b_5$ | $b_6$, $b_7$, $b_8$, $b_9$, $b_{10}$, $b_{11}$ |

As shown in Table 1, in the case of 4096-QAM, X(k) may be mapped to one among 4096 constellation points applied with a Gray code. Accordingly, each of the real part and the imaginary part may use six bits. Specifically, the real part may use six bits, i.e., $b_0$, $b_1$, $b_2$, $b_3$, $b_4$, and $b_5$, and the imaginary part may use six bits, i.e., $b_6$, $b_7$, $b_8$, $b_9$, $b_{10}$, and $b_{11}$. Each bit index may have a different meaning. For example, $b_0$ and $b_6$ may be bits on which hard decision is made by the sign of the reception signal. In the case of 16-QAM, the real part may use two bits, i.e., $b_0$ and $b_1$ and the imaginary part may use two bits, i.e., $b_2$ and $b_3$. In the case of 64-QAM, the real part may use three bits, i.e., $b_0$, $b_1$, and $b_2$ the imaginary part may use three bits, i.e., $b_3$, $b_4$, and $b_5$. In the case of 256-QAM, the real part may use four bits, i.e., $b_0$, $b_1$, $b_2$, and $b_3$, the imaginary part may use four bits, i.e., $b_4$, $b_5$, $b_6$, and $b_7$. In the case of 1024-QAM, the real part may use four bits, i.e., $b_0$, $b_1$, $b_2$, $b_3$, and $b_4$, the imaginary part may use four bits, i.e., $b_5$, $b_6$, $b_7$, $b_8$, and $b_9$.

X(k) may be mapped to one among 64 values of {−63A, −61A, . . . , −3A, −1A, +1A, +3A, . . . , +61A, +63A} that are independently gray coded. Hereinafter, k indicating a subcarrier may be omitted.

The result of mapping and zero-forcing the reception symbol y(n) by the demapper 231 may be expressed as Equation 2 below.

$$Z = Z_{re} + jZ_{im} = Y/H \quad \text{[Equation 2]}$$

At this time, $Z_{re}$ represents the real part of Z, and $Z_{im}$ represents the imaginary part of Z.

When the demapper 231 accurately knows a channel H(K), LLR of bi may be expressed as Equation 3.

$$LLR(b_i) = \log\left(\frac{p(Z_{re} \mid b_i = 1)}{p(Z_{re} \mid b_i = 0)}\right) \quad \text{[Equation 3]}$$

For Equation 3, if the conditional probability density function is obtained using a Gaussian with a mean of 0 and a variance of σ2, it may be expressed as Equation 4.

$$LLR(b_i) = \log\left(\frac{\sum_{s_1 \in S_i(1)} \exp\left[-|H|^2 (Z_{re} - s_1)^2 / 2\sigma^2\right]}{\sum_{s_0 \in S_i(0)} \exp\left[-|H|^2 (Z_{re} - s_0)^2 / 2\sigma^2\right]}\right) \quad \text{[Equation 4]}$$

At this time, $S_i(0)$ is a constellation set of which the value of $b_i$ is 0, and $S_i(\mathbf{1})$ is a constellation set of which the value of $b_i$ is 1.

When the maximum likelihood algorithm is applied to the Equation 4, Equation 5 may be obtained.

$$LLR(b_i) \approx \frac{|H|^2}{2\sigma^2}\left(\min_{s_0 \in S_i(0)} (Z_{re} - s_0)^2 - \min_{s_1 \in S_i(1)} (Z_{re} - s_1)^2\right) \quad \text{[Equation 5]}$$

In an embodiment, the demapper 231 may use a simplified algorithm instead of the maximum likelihood algorithm having high implementation complexity.

For example, the demapper 231 may use a piecewise linear function. Specifically, the demapper 231 may divide the expression for the bit into a plurality of sections and approximate each of the plurality of sections by a linear function, so as to express the expression for the bit as a plurality of linear functions. Thereafter, the demapper 231 may derive the LLR by using a plurality of piecewise linear functions. The method of deriving the LLR by using piecewise linear functions is widely used since it has low complexity and shows low performance degradation compared to the maximum likelihood algorithm.

Specifically, Equation 5 may be expressed as Equation 6 by substituting the $s_0$ and $s_1$ constellation points, which are the nearest points, for each section, and removing the constant $2A/\sigma^2$.

$$LLR(b_i) \approx |H|^2 \lambda(b_i) \quad \text{[Equation 6]}$$

For example, in the case of 4096-QAM, the piecewise linear function according to the plurality of sections obtained through Equation 6 may be expressed as Table 2. Specifically, Table 2 shows the piecewise linear function for $b_0$.

TABLE 2

| $Z_{re}$ | $\lambda$ ($b_0$) | $Z_{re}$ | $\lambda$ ($b_0$) |
|---|---|---|---|
| $Z_{re}$ < −62 A | 32 · (31 A + $Z_{re}$) | $Z_{re}$ > 62 A | 32 · (−31 A + $Z_{re}$) |
| −62 A < $Z_{re}$ ≤ −60 A | 31 · (30 A + $Z_{re}$) | 60 A < $Z_{re}$ ≤ 62 A | 31 · (−30 A + $Z_{re}$) |
| −60 A < $Z_{re}$ ≤ −58 A | 30 · (29 A + $Z_{re}$) | 58 A < $Z_{re}$ ≤ 60 A | 30 · (−29 A + $Z_{re}$) |
| −58 A < $Z_{re}$ ≤ −56 A | 29 · (28 A + $Z_{re}$) | 56 A < $Z_{re}$ ≤ 58 A | 29 · (−28 A + $Z_{re}$) |
| −56 A < $Z_{re}$ ≤ −54 A | 28 · (27 A + $Z_{re}$) | 54 A < $Z_{re}$ ≤ 56 A | 28 · (−27 A + $Z_{re}$) |
| −54 A < $Z_{re}$ ≤ −52 A | 27 · (26 A + $Z_{re}$) | 52 A < $Z_{re}$ ≤ 54 A | 27 · (−26 A + $Z_{re}$) |
| −52 A < $Z_{re}$ ≤ −50 A | 26 · (25 A + $Z_{re}$) | 50 A < $Z_{re}$ ≤ 52 A | 26 · (−25 A + $Z_{re}$) |
| . . . | . . . | . . . | . . . |

As another example, the demapper 231 may use an approximation function. Specifically, the demapper 231 may approximate the expression for the bit by using only absolute value, addition, and subtraction operations. For example, the demapper 231 may calculate one equation that is independent of piecewise linear equation for each bit by using absolute value. Thereafter, the demapper 231 may derive the LLR by using the approximated equation.

For example, in the case of 4096-QAM, the approximation function each bit may be expressed as Equation 7. Meanwhile, $b_0$, $b_1$, $b_2$, $b_3$, $b_4$, and $b_5$ representing the real part and $b_6$, $b_7$, $b_8$, $b_9$, $b_{10}$, and $b_{11}$ representing the imaginary part may be independently calculated, and in this specification, the bits representing the real part is described. Calculations for the real part may be equally applied to the imaginary part.

$$\begin{aligned} \lambda(b_0) &= Z_{re} \\ \lambda(b_1) &= -|Z_{re}| + 32A \\ \lambda(b_2) &= -||Z_{re}| - 32A| + 16A \\ \lambda(b_3) &= -|||Z_{re}| - 32A| - 16A| + 8A \\ \lambda(b_4) &= -||||Z_{re}| - 32A| - 16A| - 8A| + 4A \\ \lambda(b_5) &= -|||||Z_{re}| - 32A| - 16A| - 8A| - 4A| + 2A \end{aligned} \quad \text{[Equation 7]}$$

If Equation 7 is rearranged, Equation 8 may be obtained.

$$\begin{aligned} \lambda(b_0) &= Z_{re} \\ \lambda(b_1) &= -|\lambda(b_0)| + 32A \\ \lambda(b_2) &= -|\lambda(b_1)| + 16A \\ \lambda(b_3) &= -|\lambda(b_2)| + 8A \\ \lambda(b_4) &= -|\lambda(b_3)| + 4A \\ \lambda(b_5) &= -|\lambda(b_4)| + 2A \end{aligned} \quad \text{[Equation 8]}$$

As a still another example, the demapper 231 may use a hybrid function. Specifically, the demapper 231 may perform approximation by using the piecewise linear function with respect to some bits among a plurality of bits, and by using the approximation function with respect to some bits among the plurality of bits. For example, the demapper 231 may derive the LLR by using the piecewise linear function with respect to $b_0$ and $b_6$, and using the approximation function with respect to remaining bits.

However, since Z is a complex number, in order to use Z described in Equation 2, a division operation may be required as shown in Equation 9 below.

$$Z = Y/H = YH^*/|H|^2 \quad \text{[Equation 9]}$$

Herein, H* is conjugate of the channel H.

In summary, each of the methods by which the demapper 231 derives the LLR by using the piecewise linear function, the approximation function, or the hybrid function may include a division operation that divides the reception signal into channel H. However, since the division operation requires many components from a hardware perspective, as the components for the division operation occupies larger area and the calculation becomes complex, the calculation speed may become slower.

The demapper 231 according to an embodiment may derive the LLR by using channel status data. The channel status data may be a value obtained by reflecting the channel response value H to Z in advance. Specifically, as shown in Equation 10 below, the demapper 231 may determine a value obtained by Z with A|H|$^2$ as a first status data CY.

$$CY = Z \cdot A|H|^2 = Y/H \cdot AH^* H = Y \cdot AH^* \quad \text{[Equation 10]}$$

In addition, as shown in Equation 11 below, the demapper 231 may determine a value obtained by multiplying A by A|H|$^2$ as a second status data CSI.

$$CSI = A \cdot A|H|^2 = |AH|^2 \quad \text{[Equation 11]}$$

The demapper 231 may apply the channel status data CY and CSI to the piecewise linear function, the approximation function, and the hybrid function. Accordingly, the demapper 231 may derive the LLR without performing the division operation.

By using the first status data CY and the second status data CSI obtained according to the Equation 10 and the Equation 11, the Equation 8 may be expressed as Equation 12.

$$\begin{aligned} LLR(b_0) &= CY_{re} \quad \text{[Equation 12]} \\ LLR(b_1) &= -|LLR(b_0)| + 32CSI \\ LLR(b_2) &= -|LLR(b_1)| + 16CSI \\ LLR(b_3) &= -|LLR(b_2)| + 8CSI \\ LLR(b_4) &= -|LLR(b_3)| + 4CSI \\ LLR(b_5) &= -|LLR(b_4)| + 2CSI \end{aligned}$$

The specific configuration of the demapper 231 that derives the LLR by using the first status data CY and the second status data CSI will be later described with reference to FIG. 3 to FIG. 7.

Figure 3:
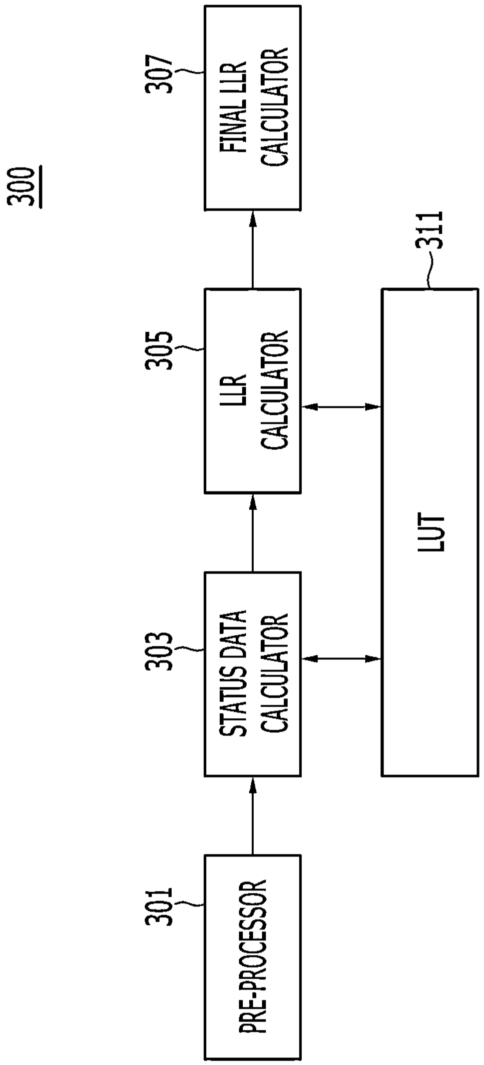
FIG. 3 is a block diagram of a demapper according to an embodiment.

FIG. 3 is a block diagram of a demapper according to an embodiment.

Referring to FIG. 3, a demapper 300 may include a pre-processor 301, a status data calculator 303, an LLR calculator 305, a final LLR calculator 307, and a lookup table (LUT) 311.

The pre-processor 301 may receive the reception symbol y(n) and the channel estimation value h(n) from the transceiver 220 (refer to FIG. 2). At this time, the reception symbol y(n) may be an M-QAM symbol (M=$2^n$, n is an integer of 2 or more).

In an embodiment, the pre-processor 301 may obtain information on the modulation type based on the reception symbol y(n). In addition, the pre-processor 301 may generate a selection signal required for the LLR calculator 305 to calculate the LLR, based on the modulation type of the reception symbol y(n).

In an embodiment, the pre-processor 301 may transfer the information on the modulation type and the selection signal to the status data calculator 303. In an embodiment, the pre-processor 301 may transfer the information on the modulation type and the selection signal to the LLR calculator 305.

The status data calculator 303 may calculate the first status data CY and the second status data CSI. For example, the status data calculator 303 may calculate the first status data CY and the second status data CSI based on the reception symbol y(n) and the channel estimation value h(n). As described above, the first status data CY may be a value obtained by multiply the Z value by A|H|$^2$, and the second status data CSI may be a value obtained by multiply the value A by A|H|$^2$. At this time, the value A may be a preset value. In addition, the channel value H may be a channel estimation value h(n) obtained from the transceiver 220 (refer to FIG. 1 and FIG. 2). The status data calculator 303 may output the calculated first status data CY and the second status data CSI to the LLR calculator 305.

Meanwhile, the status data calculator 303 may calculate values (e.g., a value obtained by multiplying the second status data by an arbitrary constant) required for the LLR calculator 305 to calculate the LLR.

The LLR calculator 305 may calculate Euclidean distances between at least two candidates to which the reception symbol y(n) and the reception symbol y(n) may be mapped, and may calculate the LLR with respect to each of the plurality of bits based on the Euclidean distances.

In an embodiment, the LLR calculator 305 may calculate the LLR with respect to each of the plurality of bits by using at least one of the piecewise linear function, the approximation function, and the hybrid function. The structure of the LLR calculator 305 and the method by which the LLR calculator 305 calculates the LLR will be described later with reference to FIG. 4 to FIG. 8.

The lookup table 311 may store Euclidean distances between the reception symbol y(n) and at least two candidates and indices of the selected candidates with respect to a specific bit. For example, the lookup table 311 may store mapping relationship between the plurality of bits representing the reception symbol y(n) and the reception symbol y(n) according to the modulation type. The LLR calculator 305 may calculate the LLR with respect to other bits by using the Euclidean distances and indices with respect to the specific bit stored in the lookup table 311. For example, when the index of a single bit within the plurality of bits is an even number, the LLR calculator 305 may calculate the LLR with respect to another bit whose index within the plurality of bits is an even number, based on the reception signal and the selected candidates. In addition, when the index of a single bit within the plurality of bits is an odd number, the LLR calculator 305 may calculate the LLR with respect to another bit whose index within the plurality of bits is an odd number, based on the reception signal and the selected candidates. For still another example, the LLR calculator 305 may calculate the LLR of $b_2$ bit by using the Euclidean distances and the indices stored in the lookup table 311. The LLR calculator 305 may calculate the LLR of $b_2$ bit by using a constellation point having the smallest Euclidean distance among constellation points with respect to the case where $b_2$ bit is 0 and a constellation point having the smallest Euclidean distance among constellation points with respect to the case where $b_2$ bit is 1.

The final LLR calculator 307 may combine the LLR with respect to each of the plurality of bits. For example, the final LLR calculator 307 may combine the LLR with respect to $\{b_0, b_2, \ldots, b_{n-2}\}$ and $\{b_1, b_3, \ldots, b_{n-1}\}$.

Figure 4:
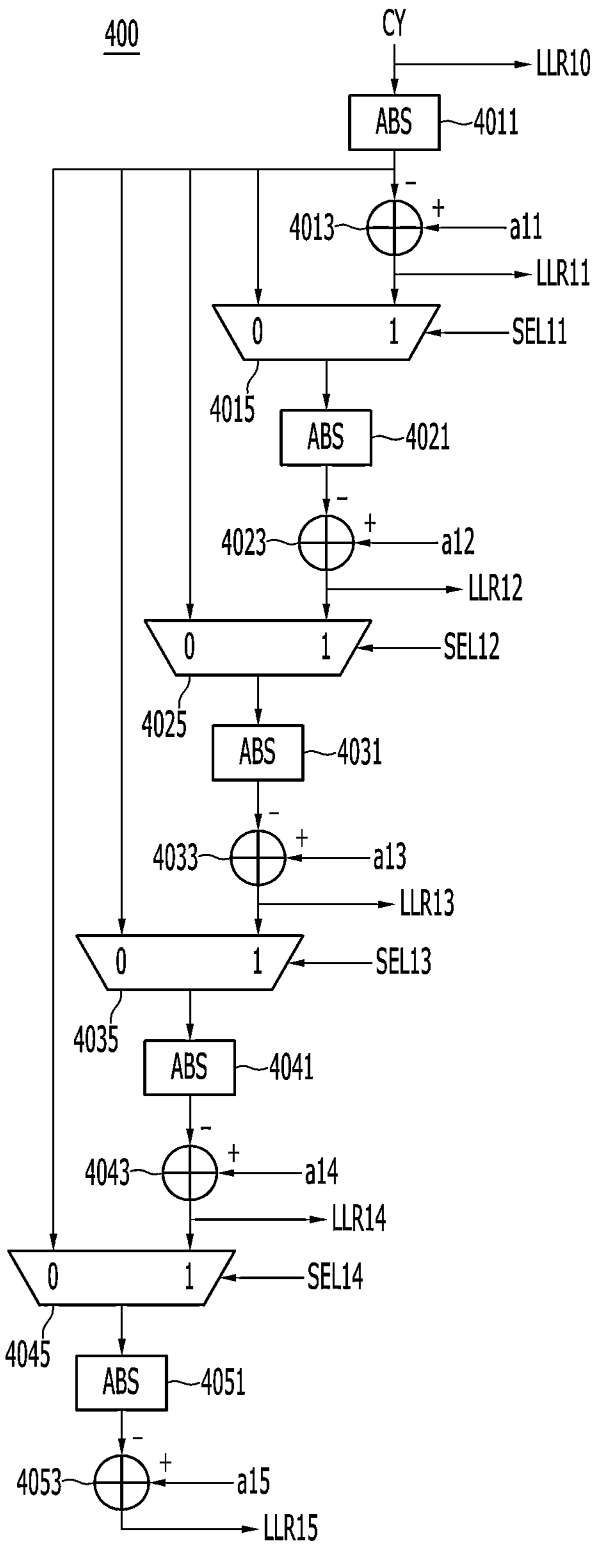
FIG. 4 is a block diagram showing an LLR calculator according to an embodiment.

FIG. 4 is a block diagram showing an LLR calculator according to an embodiment.

In more detail, FIG. 4 is a block diagram showing an LLR calculator 400 in the case where the demapper 231 (refer to FIG. 2) calculates the LLR by using an approximation function.

As shown in FIG. 4, the LLR calculator 400 may include a plurality of calculation units 401*a*, 401*b*, 401*c*, 401*d*, and 401*e* and a plurality of selectors 4015, 4025, 4035, and 4045.

Each of the plurality of calculation units 401*a*, 401*b*, 401*c*, 401*d*, and 401*e* may include corresponding absolute value detectors 4011, 4021, 4031, 4041, and 4051 and corresponding adders 4013, 4023, 4033, 4043, and 4053.

The first status data CY may be input to the first absolute value detector 4011 from the status data calculator 303 (refer to FIG. 3). At this time, the first status data CY may be transferred to the final LLR calculator 307 (refer to FIG. 3) as a first LLR value LLR10.

The first absolute value detector 4011 may receive the first status data CY, and may output an absolute value with respect to the first status data CY.

The first adder 4013 may receive a first value a11 and an output of the first absolute value detector 4011. The first adder 4013 may subtract the output of the first absolute value detector 4011 from the first value a11. For example, the first value a11 may be a value obtained by multiplying the second status data CSI by $2^5$, i.e., 32.

At this time, an output (i.e., $-|CY|+32\times CSI$) of the first adder 4013 may be transferred to the final LLR calculator 307 (refer to FIG. 3) as a second LLR value LLR11.

The first selector 4015 may include a first input terminal and a second input terminal. The output of the first absolute value detector 4011 (i.e., $|CY|$) may be input to the first input terminal of the first selector 4015. An output (i.e., $-|CY|+32\times CSI$) of the first adder 4013 may be input to the second input terminal of the first selector 4015. The first selector 4015 may output a signal input to the first input terminal of the first selector 4015 or output a signal input to the second input terminal of the first selector 4015 according to a first selection signal SEL11.

The second absolute value detector 4021 may receive an output of the first selector 4015, and may output an absolute value with respect to the output of the first selector 4015.

The second adder 4023 may receive a second value a12 and an output of the second absolute value detector 4021. The second adder 4023 may subtract the output of the second absolute value detector 4021 from the second value a12. For example, the second value a12 may be a value obtained by multiply the second status data CSI by $2^4$.

At this time, an output of the second adder 4023 may be transferred to the final LLR calculator 307 (refer to FIG. 3) as a third LLR value LLR12.

The second selector 4025 may include a first input terminal and a second input terminal. The output of the first absolute value detector 4011 (i.e., $|CY|$) may be input to the first input terminal of the second selector 4025. The output of the second adder 4023 (i.e., the third LLR value LLR12) may be input to the second input terminal of the second selector 4025. The second selector 4025 may output a signal input to the first input terminal of the second selector 4025 or output a signal input to the second input terminal of the second selector 4025 according to a second selection signal SEL12.

The third absolute value detector 4031 may receive an output of the second selector 4025, and may output an absolute value with respect to the output of the second selector 4025.

The third adder 4033 may receive a third value a13 and an output of the third absolute value detector 4031. The third adder 4033 may subtract the output of the third absolute value detector 4031 from the third value a13. For example, the third value a13 may be a value obtained by multiply the second status data CSI by $2^3$.

At this time, an output of the third adder 4033 may be transferred to the final LLR calculator 307 (refer to FIG. 3) as a fourth LLR value LLR13.

The third selector 4035 may include a first input terminal and a second input terminal. The output of the first absolute value detector 4011 (i.e., $|CY|$) may be input to the first input terminal of the third selector 4035. The output of the third adder 4033 (i.e., the fourth LLR value LLR13) may be input to the second input terminal of the third selector 4035. The third selector 4035 may output a signal input to the first input terminal of the third selector 4035 or output a signal input to the second input terminal of the third selector 4035 according to a third selection signal SEL13.

The fourth absolute value detector 4041 may receive an output of the third selector 4035, and may output an absolute value with respect to the output of the third selector 4035.

The fourth adder 4043 may receive a fourth value a14 and an output of the fourth absolute value detector 4041. The fourth adder 4043 may subtract the output of the fourth absolute value detector 4041 from the fourth value a14. For example, the fourth value a14 may be a value obtained by multiply the second status data CSI by $2^2$.

At this time, an output of the fourth adder 4043 may be transferred to the final LLR calculator 307 (refer to FIG. 3) as a fifth LLR value LLR14.

The fourth selector 4045 may include a first input terminal and a second input terminal. The output of the first absolute value detector 4011 (i.e., $|CY|$) may be input to the first input terminal of the fourth selector 4045. The output of the fourth adder 4043 (i.e., the fifth LLR value LLR14) may be input to the second input terminal of the fourth selector 4045. The fourth selector 4045 may output a signal input to the first input terminal of the fourth selector 4045 or output a signal input to the second input terminal of the fourth selector 4045 according to a fourth selection signal SEL14.

The fifth absolute value detector 4051 may receive an output of the fourth selector 4045, and may output an absolute value with respect to the output of the fourth selector 4045.

The fifth adder 4053 may receive a fifth value a15 and an output of the fifth absolute value detector 4051. The fifth adder 4053 may subtract the output of the fifth absolute value detector 4051 from the fifth value a15. For example, the fifth value a15 may be a value obtained by multiplying the second status data CSI by 2.

At this time, an output of the fifth adder 4053 may be transferred to the final LLR calculator 307 (refer to FIG. 3) as a sixth LLR value LLR15.

Meanwhile, the pre-processor 301 (refer to FIG. 3) may generate a plurality of selection signals SEL11, SEL12, SEL13, and SEL14 according to the modulation type of the reception signal.

For example, in the case of 4096-QAM, the first selection signal SEL11, the second selection signal SEL12, the third selection signal SEL13, and the fourth selection signal SEL14 may be at a high level. In an embodiment, each of the plurality of selectors 4015, 4025, 4035, and 4045 may, upon receiving the selection signal of high level, output the signal input to the second input terminal.

For still another example, in the case of 1024-QAM, the first selection signal SEL11, the second selection signal SEL12 may be at a high level, and the third selection signal SEL13, and the fourth selection signal SEL14 may be at a low level. In an embodiment, each of the plurality of selectors 4015, 4025, 4035, and 4045 may, upon receiving the selection signal of low level, output the signal input to the first input terminal.

This may be formulated as Equation 13.

$$LLR10 = CY_{re} \quad \text{[Equation 13]}$$

$$LLR11 = -|LLR10| + 32CSI$$

$$LLR12 = \begin{cases} -|LLR11| + 16CSI & \text{if } QAM \geq 4096 \\ -|CY_{re}| + 16CSI & \text{otherwise} \end{cases}$$

$$LLR13 = \begin{cases} -|LLR12| + 8CSI & \text{if } QAM \geq 1024 \\ -|CY_{re}| + 8CSI & \text{otherwise} \end{cases}$$

$$LLR14 = \begin{cases} -|LLR13| + 4CSI & \text{if } QAM \geq 256 \\ -|CY_{re}| + 4CSI & \text{otherwise} \end{cases}$$

$$LLR15 = \begin{cases} -|LLR14| + 2CSI & \text{if } QAM \geq 64 \\ -|CY_{re}| + 2CSI & \text{otherwise} \end{cases}$$

For example, as shown in Equation 13, in the case of 256-QAM, it may be that LLR10=CY, LLR11=−|LLR10|+32 CSI, LLR12=−|CY|+16 CSI, LLR13=−|CY|+8 CSI, LLR14=−|CY|+4 CSI, and LLR15=−|CY|+2 CSI.

The final LLR calculator 307 (refer to FIG. 3) may receive the first LLR value LLR10, the second LLR value LLR11, the third LLR value LLR12, the fourth LLR value LLR13, the fifth LLR value LLR14, and the sixth LLR value LLR15 from the LLR calculator 305. The final LLR calculator 307 may obtain the plurality of bits used to represent the real part and the imaginary part based on a plurality of LLR values LLR10 to LLR15. In an embodiment, a position of a bit to which each of the plurality of LLR values LLR10 to LLR15 among the plurality of bits is mapped may differ according to the modulation type. The final LLR calculator 307 may map the plurality of LLR values LLR10 to LLR15 to each bit according to a preset rule as shown in Table 3 below. For example, the lookup table 311 may further include a table mapping to each of the plurality of bits based on the plurality of LLR values. The final LLR calculator 307 may map the plurality of LLR values LLR10 to LLR15 to each bit based on the table.

TABLE 3

| | QAM modification type | | | | |
|---|---|---|---|---|---|
| LLRs | 4096 | 1024 | 256 | 64 | 16 |
| LLR10 | $b_0$ | $b_0$ | $b_0$ | $b_0$ | $b_0$ |
| LLR11 | $b_1$ | | | | |
| LLR12 | $b_2$ | $b_1$ | | | |
| LLR13 | $b_3$ | $b_2$ | $b_1$ | | |
| LLR14 | $b_4$ | $b_3$ | $b_2$ | $b_1$ | |
| LLR15 | $b_5$ | $b_4$ | $b_3$ | $b_2$ | $b_1$ |

For example, in the case of 1024-QAM, the first LLR value LLR10 may be mapped to the position of b0, the third LLR value LLR12 may be mapped to the position of b1, the fourth LLR value LLR13 may be mapped to the position of b2, the fifth LLR value LLR14 may be mapped to the position of b3, and the sixth LLR value LLR15 may be mapped to the position of b4.

Figure 5:
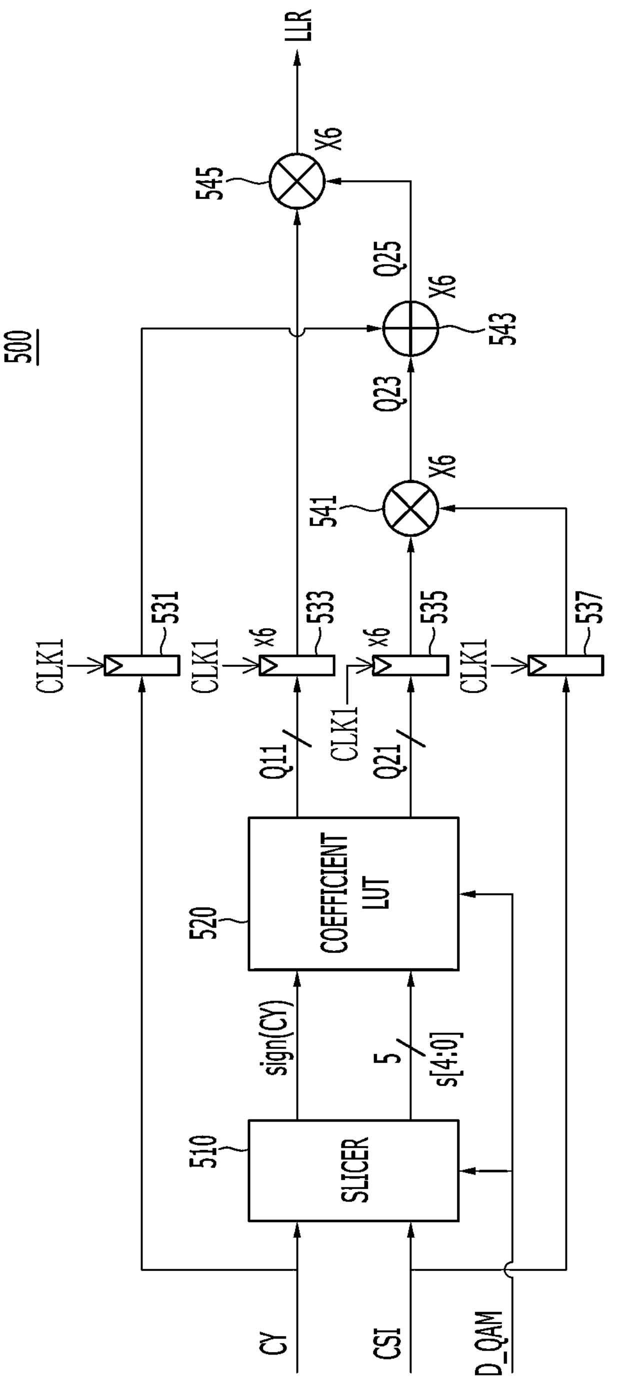
FIG. 5 is a drawing showing an LLR calculator according to an embodiment.
Figure 6:
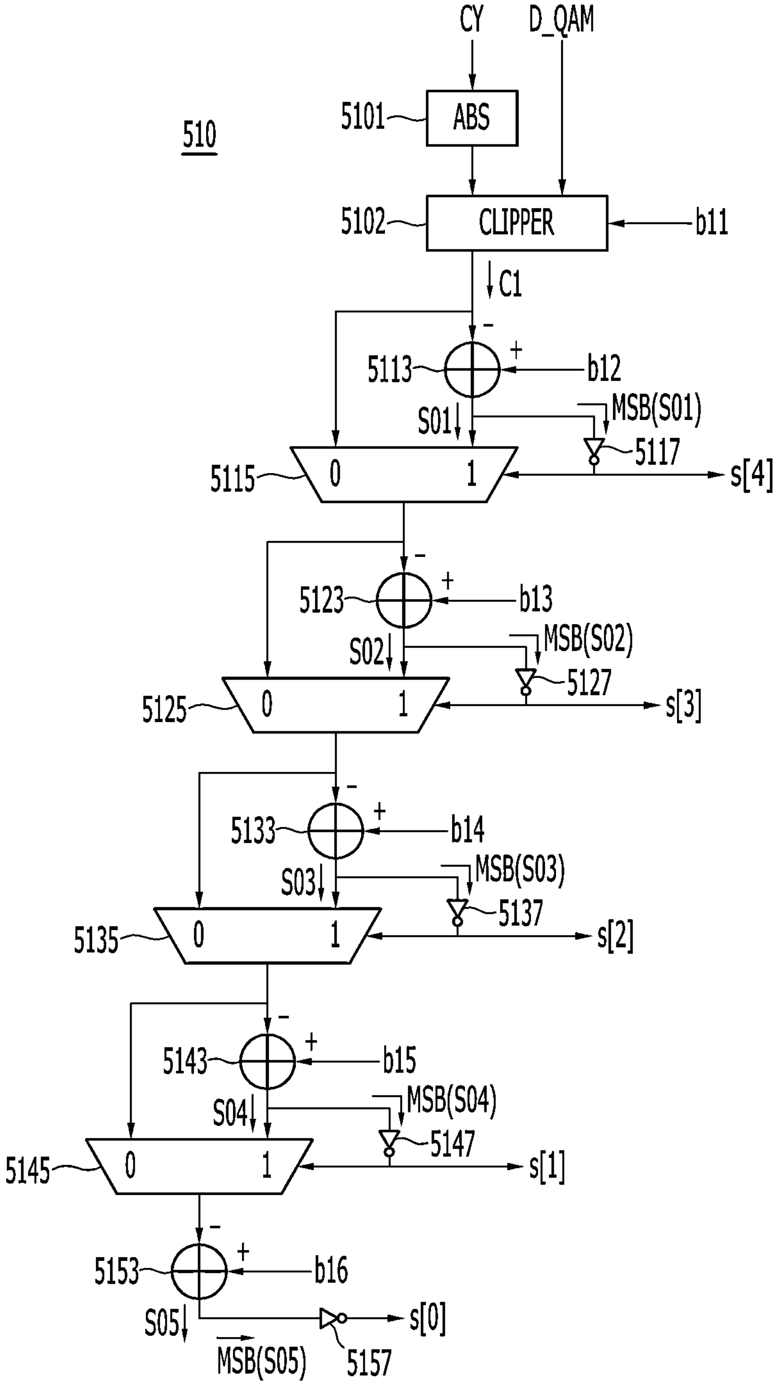
FIG. 6 is a drawing showing structure of a slicer according to FIG. 5.

FIG. 5 is a drawing showing an LLR calculator according to an embodiment. FIG. 6 is a drawing showing structure of a slicer according to FIG. 5.

In more detail, FIG. 5 is a block diagram showing an LLR calculator 500 in the case where the demapper 231 (refer to FIG. 2) calculates the LLR by using a piecewise linear function.

The LLR calculator 500 may include a slicer 510, a coefficient lookup table 520, a plurality of flip-flops 531, 533, 535, and 537, a plurality of first multipliers 541, a plurality of adders 543, and a plurality of second multipliers 545.

In FIG. 5, it is illustrated that the plurality of flip-flops 533 and the plurality of flip-flops 535 include six flip-flops, respectively, the plurality of first multipliers 541 and the plurality of second multipliers 545 include six multipliers, respectively, and the plurality of adders 543 include six adders, but the present disclosure is not limited thereto, and the LLR calculator 500 may include an appropriate quantity of multipliers or adders.

The slicer 510 may receive the first status data CY, the second status data CSI, and a modulation type D_QAM from the status data calculator 303 (refer to FIG. 3). The slicer 510 may detect a section corresponding to the reception symbol y(n) based on the first status data CY and the second status data CSI. The plurality of sections into which the reception symbol y(n) is divided according to the modulation type may be preset. Specifically, the slicer 510 may determine one section among the plurality of sections that includes the reception symbol y(n).

Referring also to FIG. 6, the slicer 510 may include an absolute value detector 5101, a clipper 5102, and a plurality of calculation units 510*a*, 510*b*, 510*c*, and 510*d*. Each of the plurality of calculation units 510*a*, 510*b*, 510*c*, and 510*d* may include corresponding adders 5113, 5123, 5133, and 5143 and a plurality of corresponding selectors 5115, 5125, 5135, and 5145.

The absolute value detector 5101 may receive the first status data CY, and may output an absolute value with respect to the first status data CY.

The clipper 5102 may limit the size of the signal to a desired threshold level while maintaining the phase of the signal. The clipper 5102 may receive an absolute value of the first status data CY from the absolute value detector 5101, and receive the modulation type D_QAM and a first value b11. The clipper 5102 may generate a clipping signal C1 by clipping the absolute value of the first status data CY based on the modulation type D_QAM and the first value b11. In an embodiment, the first value b11 may be the second status data CSI. In an embodiment, when the modulation type D_QAM indicates $2^m$-QAM, the clipper 5102 may clip the first status data CY such that the first status data CY may have a size of $2^{m/2}$×second status data (CSI) or less. Accordingly, the slicer 510 may determine the section to which the reception symbol y(n) belongs regardless of the modulation type of the reception symbol y(n).

The first adder 5113 may receive a second value b12 and the clipping signal C1. The first adder 5113 may subtract the second value b12 from an output of the clipper 5102. For example, the second value b12 may be a value obtained by multiplying the second status data CSI by 32. The first adder 5113 may output a first signal S01. At this time, the most significant bit MSB(S01) of the first signal S01 may be inverted through a first inverter 5117 and input to the first selector 5115. The inverted most significant bit MSB(S01) may be a first slicer bit s[4].

The first selector 5115 may include a first input terminal and a second input terminal. The output of the clipper 5102 (i.e., the clipping signal C1) may be input to the first input terminal of the first selector 5115. An output (i.e., the first signal S01) of the first adder 5113 may be input to the second input terminal of the first selector 5115. The first selector 5115 may output a signal input to the first input terminal of the first selector 5115 or output a signal input to the second input terminal of the first selector 5115 according to the first slicer bit s[4].

The second adder 5123 may receive a third value b13 and an output of the first selector 5115. The second adder 5123 may subtract the third value b13 from the output of the first selector 5115. For example, the third value b13 may be a value obtained by multiplying the second status data CSI by 16. The second adder 5123 may output a second signal S02. At this time, the most significant bit MSB(S02) of the second signal S02 may be inverted through a second inverter 5127 and input to the second selector 5125. The inverted most significant bit MSB(S02) may be a second slicer bit s[3].

The second selector 5125 may include a first input terminal and a second input terminal. The output of the first selector 5115 may be input to the first input terminal of the second selector 5125. An output (i.e., the second signal S02) of the second adder 5123 may be input to the second input terminal of the second selector 5125. The second selector 5125 may output a signal input to the first input terminal of the second selector 5125 or output a signal input to the second input terminal of the second selector 5125 according to the second slicer bit s[3].

The third adder 5133 may receive a fourth value b14 and an output of the second selector 5125. The third adder 5133 may subtract the fourth value b14 from the output of the second selector 5125. For example, the fourth value b14 may be a value obtained by multiplying the second status data CSI by 8. The third adder 5133 may output a third signal S03. At this time, the most significant bit MSB(S03) of the third signal S03 may be inverted through a third inverter 5137 and input to the third selector 5135. The inverted most significant bit MSB(S03) may be a third slicer bit s[2].

The third selector 5135 may include a first input terminal and a second input terminal. The output of the second selector 5125 may be input to the first input terminal of the third selector 5135. An output (i.e., the third signal S03) of the third adder 5133 may be input to the second input terminal of the third selector 5135. The third selector 5135 may output a signal input to the first input terminal of the third selector 5135 or output a signal input to the second input terminal of the third selector 5135 according to the third slicer bit s[2].

The fourth adder 5143 may receive a fifth value b15 and an output of the third selector 5135. The fourth adder 5143 may subtract the fifth value b15 from the output of the third selector 5135. For example, the fifth value b15 may be a value obtained by multiplying the second status data CSI by 4. The fourth adder 5143 may output a fourth signal S04. At this time, the most significant bit MSB(S04) of the fourth signal S04 may be inverted through a fourth inverter 5147 and input to the fourth selector 5145. The inverted most significant bit MSB(S04) may be a fourth slicer bit s[1].

The fourth selector 5145 may include a first input terminal and a second input terminal. The output of the third selector 5135 may be input to the first input terminal of the fourth selector 5145. An output (i.e., the fourth signal S04) of the fourth adder 5143 may be input to the second input terminal of the fourth selector 5145. The fourth selector 5145 may output a signal input to the first input terminal of the fourth selector 5145 or output a signal input to the second input terminal of the fourth selector 5145 according to the fourth slicer bit s[1].

A fifth adder 5153 may receive a sixth value b16 and an output of the fourth selector 5145. The fifth adder 5153 may subtract the sixth value b16 from the output of the fourth selector 5145. For example, the sixth value b16 may be a value obtained by multiplying the second status data CSI by 2. The fifth adder 5153 may output a fifth signal S05. At this time, the most significant bit MSB(S05) of the fifth signal S05 may be inverted through a fifth inverter 5157. The inverted most significant bit MSB(S05) may be a fifth slicer bit s[0].

For example, supposing that the first status data CY has the same value as 39×second status data CSI, the first signal S01 may have a value of 7×second status data CSI. At this time, supposing that the most significant bit of the first signal S01 indicates a positive number, the first slicer bit s[4] may be 0. Accordingly, the first selector 5115 may output 7×second status data CSI.

The second signal S02 may have a value of −9× second status data CSI. At this time, supposing that the most significant bit of the second signal S02 indicates a negative number, the second slicer bit s[3] may be 1. Accordingly, the second selector 5125 may output 7×second status data CSI.

The third signal S03 may have a value of −1×second status data CSI. At this time, supposing that the most significant bit of the third signal S03 indicates a negative number, the third slicer bit s[2] may be 1. Accordingly, the third selector 5135 may output 7×second status data CSI.

The fourth signal S04 may have a value of 3×second status data CSI. At this time, supposing that the most significant bit of the fourth signal S04 indicates a positive number, the fourth slicer bit s[1] may be 0. Accordingly, the fourth selector 5145 may output 3×second status data CSI.

Finally, the fifth signal S05 may have a value of 1×second status data CSI. At this time, supposing that the most significant bit of the fifth signal S05 indicates a positive number, the fifth slicer bit s[0] may be 0.

The slicer 510 may determine the section to which the reception symbol y(n) belongs based on the first to fourth slicer bits s[4:0] having sequential values of 0, 1, 1, 0, 0.

Meanwhile, conventionally, in order to determine the section to which the reception symbol y(n) belongs, a slicer can be used that sequentially compares the first state data CY and the second state data CSI multiplied by a predetermined constant. Regarding the structure of a conventional slicer, the paper by C. K. A. Yeung, J. Lee, and S. Kim "A simple slicer for soft detection in Gray-coded QAM-modulated MIMO OFDM systems," in Proc. 2012 IEEE Sarnoff Symp., pp. 1-5 and the paper by M. M. Mansour and L. Jalloul, "Optimized configurable architectures for scalable soft-input soft-output MIMO detectors with 256-QAM," IEEE Trans. Signal Process., vol. 22, no. 4, pp. 408-412, April 2015, etc., which are incorporated herein by reference in their entirety. For example, a conventional slicer compares the first state data CY and the second state data CSI multiplied by 2, the first state data CY and the second state data CSI multiplied by 4, the first state data CY and the second state data CSI multiplied by 6, etc. That is, the conventional slicer can perform comparison the first state data CY and each boundary of the section to which the corresponding reception symbol y(n) belongs. Therefore, in order to compare the first state data CY and the boundaries of all sections, the conventional slicer may require $2^{(m/2-1)}-1$ comparators for the real part for $2^m$-QAM. For example, a conventional slicer can perform comparison with 2×CSI, 4×CSI, and 6×CSI for 64-QAM. That is, a conventional slicer may include three comparators to perform slicing for 64-QAM.

On the other hand, the slicer 510 according to one embodiment may compare the first state data CY and 2^n×second state data CSI. Slicer 510 may require (m/2)−1 comparators for the real part for $2^m$-QAM. For example, the slicer 510 can perform a subtraction operation with 2×CSI and 4×CSI for 64-QAM, and can perform the operation with only two comparators.

The number of comparators required by the conventional slicer and the slicer 510 according to one embodiment is summarized as follows.

TABLE 4

| | | Number of comparators | |
|---|---|---|---|
| $2^m$-QAM | m | Conventional slicer | Slicer 510 |
| 64-QAM | 6 | 3 | 2 |
| 256-QAM | 8 | 8 | 3 |
| 1024-QAM | 10 | 15 | 4 |
| 4096-QAM | 12 | 24 | 5 |

In summary, the slicer 510 according to one embodiment may include less comparators than a conventional slicer.

Referring back to FIG. 5, the slicer 510 may transfer a sign(CY) of the first status data CY and the first to fourth slicer bits s[4:0] to the coefficient lookup table 520.

Meanwhile, the reception signal expressed as a piecewise linear function may be expressed as Equation 14.

$$LLR(b_i) = \alpha_i \cdot (\beta_i \cdot CSI + CY_{re}) \quad \text{[Equation 14]}$$

Here, α and β may be coefficients to be multiplied to the first status data CY and the second status data CSI. α and β may have different values according to the modulation type D_QAM, the bit index, the section to which the reception symbol y(n) belongs.

The coefficient lookup table 520 may store information on the coefficient to be multiplied to the first status data CY and the second status data CSI at the time of calculating the LLR according to section corresponding to the reception signal. That is, the coefficient lookup table 520 may include information on α and β. In an embodiment, the coefficient lookup table 520 may output corresponding coefficient based on the sign CY of the first status data CY transferred from the slicer 510, the first to fourth slicer bits s[4:0], the modulation type D_QAM. Specifically, the coefficient lookup table 520 may output a first coefficient Q11 and a second coefficient Q21. The coefficient lookup table 520 may store α, which is a coefficient multiplied to the first status data CY, as the first coefficient Q11, and store β, which is a coefficient multiplied to the first status data CY and the second status data CSI, as the second coefficient Q21.

For example, the coefficient lookup table 520 may store information such as Table 5. Table 5 shows bit b0 of the reception signal according to 4096-QAM.

TABLE 5

| | LUT | |
|---|---|---|
| | $\alpha_0$ | $\beta_0$ |
| $CY_{re} < -62CSI$ | 32 | 31 |
| $-62CSI < CY_{re} \le -60CSI$ | 31 | 30 |
| $-60CSI < CY_{re} \le -58CSI$ | 30 | 29 |
| $-58CSI < CY_{re} \le -56CSI$ | 29 | 28 |
| $-56CSI < CY_{re} \le -54CSI$ | 28 | 27 |
| $-54CSI < CY_{re} \le -52CSI$ | 27 | 26 |
| $-52CSI < CY_{re} \le -50CSI$ | 26 | 25 |
| . . . | . . . | . . . |

Meanwhile, although FIG. 5 illustrates that the LLR calculator 500 includes the coefficient lookup table 520, but the present disclosure is not limited thereto, and the coefficient lookup table 520 may also be included in the lookup table 311 (refer to FIG. 3). In this case, the slicer 510 may read a corresponding coefficient from the lookup table 311 (refer to FIG. 3), and use the read coefficient.

The plurality of flip-flops 531, 533, 535, and 537 may output the input signal based on one clock signal CLK1.

A first flip-flop 531 may receive the first status data CY, and may output the first status data CY based on the clock signal CLK1.

A second flip-flop 533 may receive the first coefficient Q11, and may output the first coefficient Q11 based on the clock signal CLK1.

A third flip-flop 535 may receive the second coefficient Q21, and may output the second coefficient Q21 based on the clock signal CLK1.

A fourth flip-flop 537 may receive the second status data CSI, and may output the second status data CSI based on the clock signal CLK1.

A first multiplier 541 may receive the second coefficient Q21 from the third flip-flop 535, and may receive the second status data CSI from the fourth flip-flop 537. The first multiplier 541 may output a first output value Q23 by multiplying the second coefficient Q21 and the second status data CSI.

The first adder 543 may receive the first output value Q23 from the first multiplier 541, and may receive the first status data CY from the first flip-flop 531. The first adder 543 may output a second output value Q25 by adding the first output value Q23 and the first status data CY.

The second multiplier 545 may receive the first coefficient Q11 from the second flip-flop 533, and may receive the second output value Q25 from the first adder 543. The second multiplier 545 may calculate the LLR by multiplying the first coefficient Q11 and the second output value Q25. In summary, LLR may be expressed as Equation 15.

$$LLR = Q11 \times Q25 = Q11 \times (Q23 + CY) = Q11 \times (Q21 \times CSI + CY) \quad \text{[Equation 15]}$$

At this time, Q11 may be α, and Q21 may be β.

Since, after the first multiplier 541 obtains the first output value Q23 by performing the multiplication operation, the second multiplier 545 performs the multiplication operation based on the first output value Q23, the LLR calculator 500 may perform the multiplication operation in series.

Figure 7:
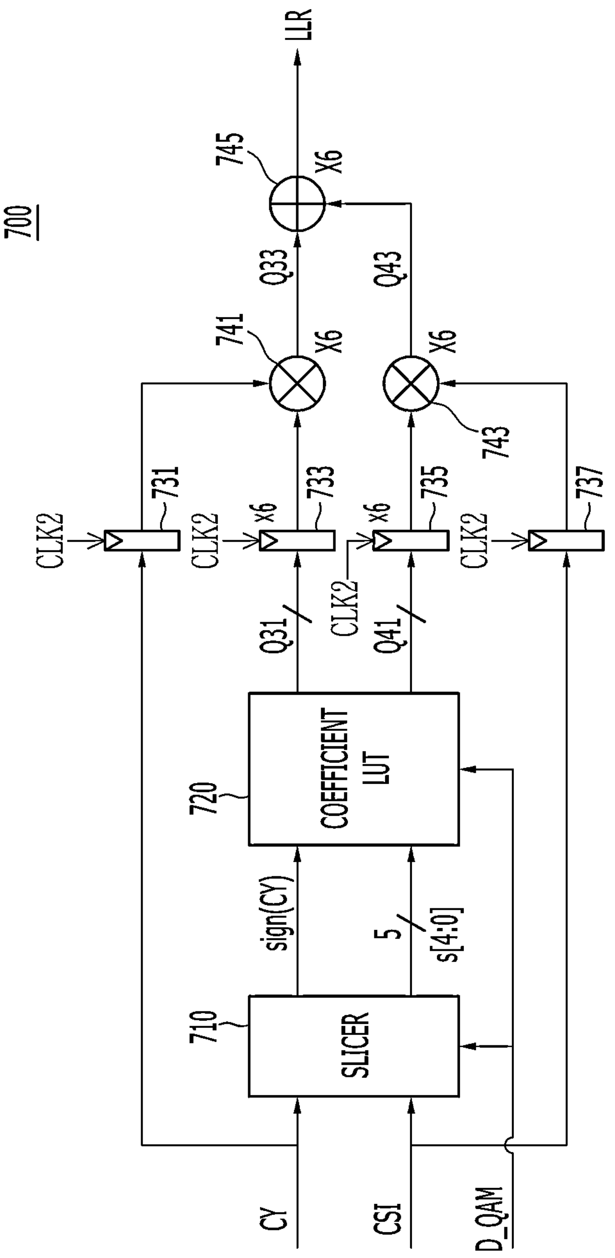
FIG. 7 is a drawing showing an LLR calculator according to still another embodiment.

FIG. 7 is a drawing showing an LLR calculator according to still another embodiment.

In more detail, FIG. 7 is a block diagram showing an LLR calculator 700 in the case where the demapper 231 (refer to FIG. 2) calculates the LLR by using a piecewise linear function.

The LLR calculator 700 may include a slicer 710, a coefficient lookup table 720, a plurality of flip-flops 731, 733, 735, and 737, a plurality of first multipliers 741, a plurality of second multipliers 743, and a plurality of adders 745.

In FIG. 7, it is illustrated that the plurality of flip-flops 733 and the plurality of flip-flops 735 include six flip-flops, respectively, the plurality of first multipliers 741 and the plurality of second multipliers 743 include six multipliers, respectively, and the plurality of adders 745 include six adders, but the present disclosure is not limited thereto, and the LLR calculator 700 may include an appropriate quantity of multipliers or adders.

The slicer 710 may receive the first status data CY, the second status data CSI, and the modulation type D_QAM from the status data calculator 303 (refer to FIG. 3). The slicer 710 may detect a section corresponding to the reception symbol y(n) based on the first status data CY and the second status data CSI. The plurality of sections into which the reception symbol y(n) is divided according to the modulation type may be preset. Specifically, the slicer 710 may determine that the reception symbol y(n) is included in one section among the plurality of sections.

The coefficient lookup table 720 may store information on the coefficient to be multiplied to the first status data CY and the second status data CSI at the time of calculating the LLR according to section corresponding to the reception signal. That is, the coefficient lookup table 720 may include information on α and β. In an embodiment, the coefficient lookup table 720 may output corresponding coefficient based on the sign (CY) of the first status data CY transferred from the slicer 710, the first to fourth slicer bits s[4:0], and the modulation type D_QAM. Specifically, the coefficient lookup table 720 may output a first coefficient Q31 and a second coefficient Q41.

Meanwhile, the coefficient lookup table 720 may store α, which is a coefficient multiplied to the first status data CY, as the first coefficient Q31, and store α×β, which is a coefficient multiplied to the second status data CSI, as the second coefficient Q41.

For example, the coefficient lookup table 720 may store information such as Table 6. Table 6 shows bit b0 of the reception signal according to 4096-QAM.

TABLE 6

| | LUT | |
|---|---|---|
| | $\alpha_0$ | $\alpha_0 \cdot \beta_0$ |
| $CY_{re} < -62CSI$ | 32 | 992 |
| $-62CSI < CY_{re} \le -60CSI$ | 31 | 930 |
| $-60CSI < CY_{re} \le -58CSI$ | 30 | 870 |
| $-58CSI < CY_{re} \le -56CSI$ | 29 | 812 |
| $-56CSI < CY_{re} \le -54CSI$ | 28 | 756 |
| $-54CSI < CY_{re} \le -52CSI$ | 27 | 702 |
| $-52CSI < CY_{re} \le -50CSI$ | 26 | 650 |
| ... | ... | ... |

Meanwhile, although FIG. 7 illustrates that the LLR calculator 700 includes the coefficient lookup table 720, but the present disclosure is not limited thereto, and the coefficient lookup table 720 may also be included in the lookup table 311 (refer to FIG. 3). In this case, the slicer 710 may read a corresponding coefficient from the lookup table 311 (refer to FIG. 3), and use the read coefficient.

A plurality of flip-flops 731, 733, 735, and 737 may output the input signal based on one clock signal CLK2.

A first flip-flop 731 may receive the first status data CY, and may output the first status data CY based on the clock signal CLK2.

A second flip-flop 733 may receive the first coefficient Q31, and may output the first coefficient Q31 based on the clock signal CLK2.

A third flip-flop 735 may receive the second coefficient Q41, and may output the second coefficient Q41 based on the clock signal CLK2.

A fourth flip-flop 737 may receive the second status data CSI, and may output the second status data CSI based on the clock signal CLK2.

A first multiplier 741 may receive the first coefficient Q31 from the second flip-flop 733, and may receive the first status data CY from the first flip-flop 731. The first multiplier 741 may output a first output value Q33 by multiplying the first coefficient Q31 and the first status data CY.

A second multiplier 743 may receive the second coefficient Q41 from the third flip-flop 735, and may receive the second status data CSI from the fourth flip-flop 737. The second multiplier 743 may multiply the second coefficient Q41 and the second status data CSI.

A first adder 745 may receive the first output value Q33 from the first multiplier 741, and may receive a second output value Q43 from the second multiplier 743. The first adder 745 may calculate the LLR by adding the first output value Q33 and the second output value Q43. In summary, LLR may be expressed as Equation 16.

$$LLR = Q33 + Q43 = Q31 \times CY + Q41 \times CSI \qquad \text{[Equation 16]}$$

At this time, Q31 may be α, and Q41 may be α×β.

Accordingly, since the first multiplier 741 and the second multiplier 743 perform the multiplication operation, the LLR calculator 700 may perform the multiplication operation in parallel.

Figure 8:
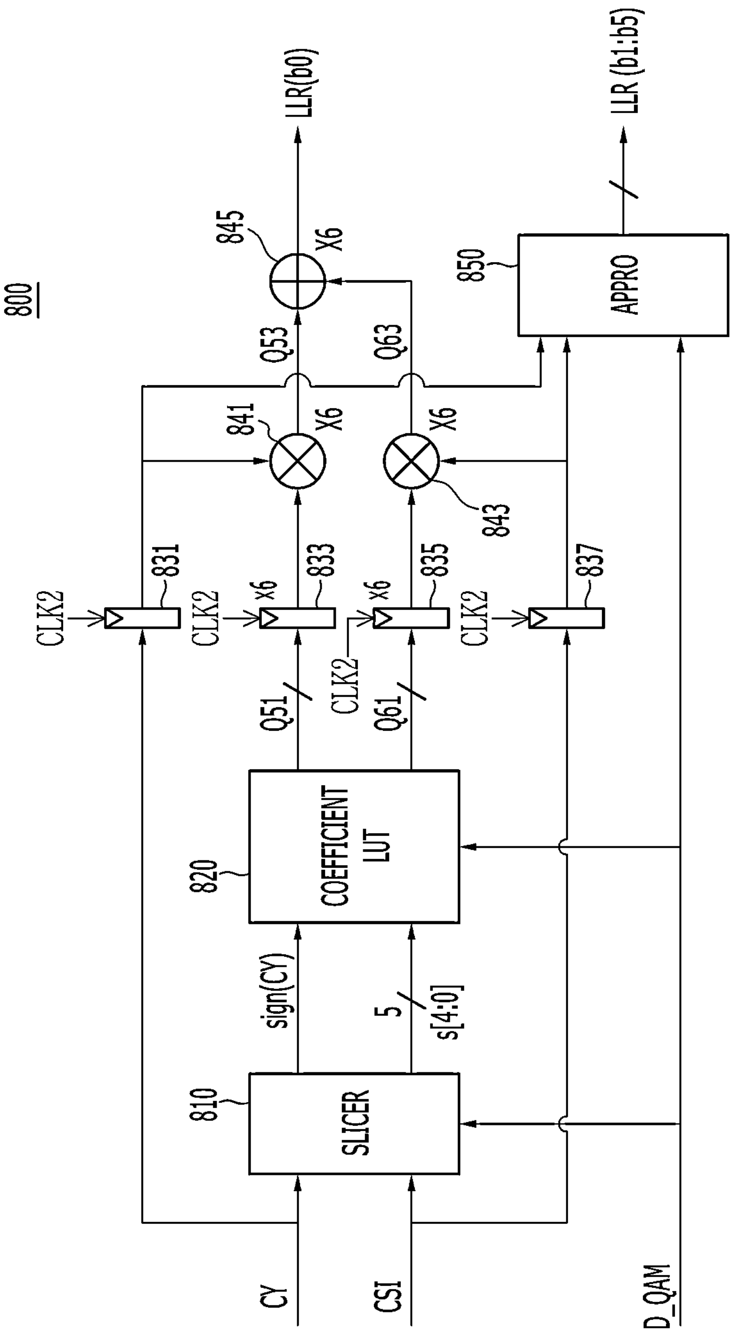
FIG. 8 is a block diagram showing an LLR calculator according to still another embodiment.

FIG. 8 is a block diagram showing an LLR calculator according to still another embodiment.

In more detail, FIG. 8 is a block diagram showing an LLR calculator 800 in the case where the demapper 231 (refer to FIG. 2) calculates the LLR by using a hybrid function. For example, the LLR calculator 800 may calculate the LLR by using the piecewise linear function with respect to b0 among the plurality of bits, and may calculate the LLR by using the approximation function with respect to remaining bits excluding b0 from among the plurality of bits.

The LLR calculator 800 may include a slicer 810, coefficient lookup table 820, a plurality of flip-flops 831, 833, 835, and 837, a plurality of first multipliers 841, a plurality of second multipliers 843, a plurality of adders 845, and an approximated LLR calculator 850.

Referring to FIG. 7, the description regarding the LLR calculator 700 may also be applied to the LLR calculator 800.

Meanwhile, the LLR calculator 800 may further include the approximated LLR calculator 850. In an embodiment, the approximated LLR calculator 850 may be the LLR calculator 400 according to FIG. 4.

The approximated LLR calculator 850 may receive the first status data CY from a first flip-flop 831, and may receive the second status data CSI from a fourth flip-flop 837. The approximated LLR calculator 850 may calculate the LLR with respect to remaining bits excluding b0 from among the plurality of bits. Meanwhile, the present disclosure is not limited thereto, and the LLR calculator 800 may use the approximation function with respect to some bits among the plurality of bits as needed, and may use the piecewise linear function with respect to some bits among the plurality of bits to calculate the LLR.

Figure 9:
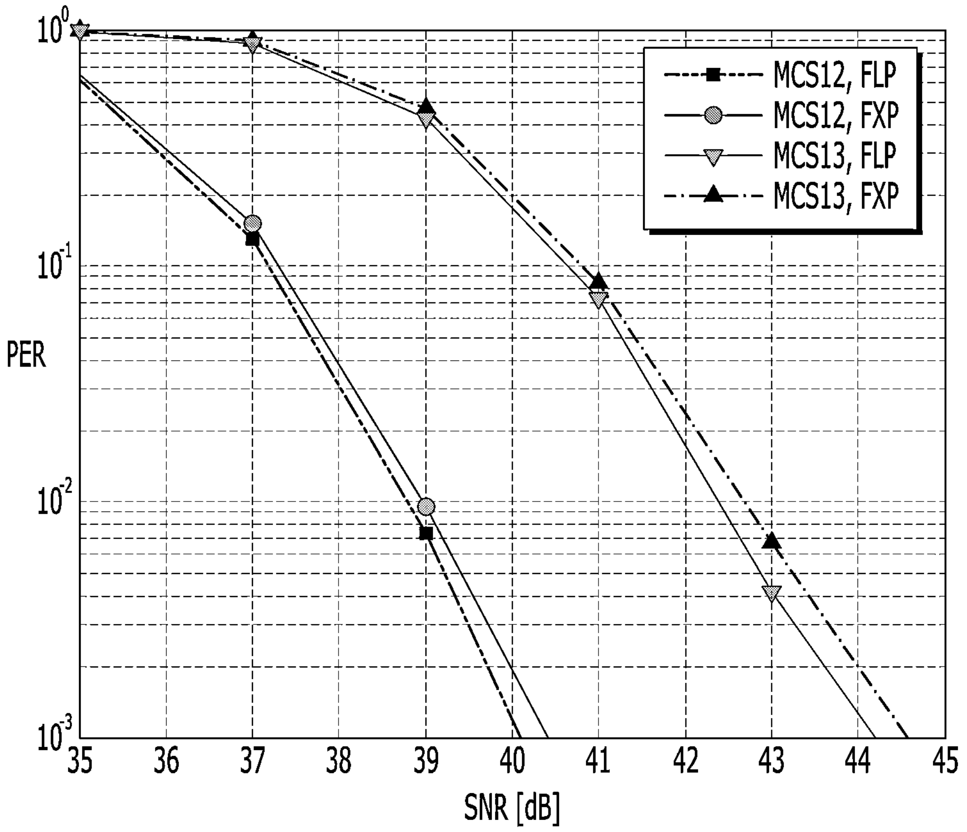
FIG. 9 is a drawing schematically showing packet error rate (PER) according to signal to noise ratio (SNR) in a communication system according to an embodiment.

FIG. 9 is a drawing schematically showing packet error rate (PER) according to signal to noise ratio (SNR) in a communication system according to an embodiment.

FIG. 9 shows the case that the demapper 231 (refer to FIG. 2) according to an embodiment calculates the LLR by using the piecewise linear function. The communication system used extremely high throughput (EHT) packets using Channel D, frequency offset of 20 ppm, and 4096-QAM of 1×1 BW 160 MHz. In addition, the first state data with 22 bits and the second state data with 21 bits were used as inputs to the demapper 231 in order to support 4096-QAM.

In more detail, the demapper 231 may use a floating-point (FLP) C model or a fixed-point (FXP) C model. In addition, the demapper 231 may use a modulation coding scheme (MCS)12 method or an MCS13 method. MCS12 may be the case that a coding rate in the modulation type of 4096-QAM is ¾, and MCS13 may be the case that a coding rate in the modulation type of 4096-QAM is ⅚.

As shown in FIG. 9, when MCS 12 is used, FLP C model may have an SNR that is lower than FXP C model by 0.3 dB at maximum. When MCS13 method is used, FLP C model may have an SNR that is lower than FXP C model by 0.4 dB at maximum.

Figure 10:
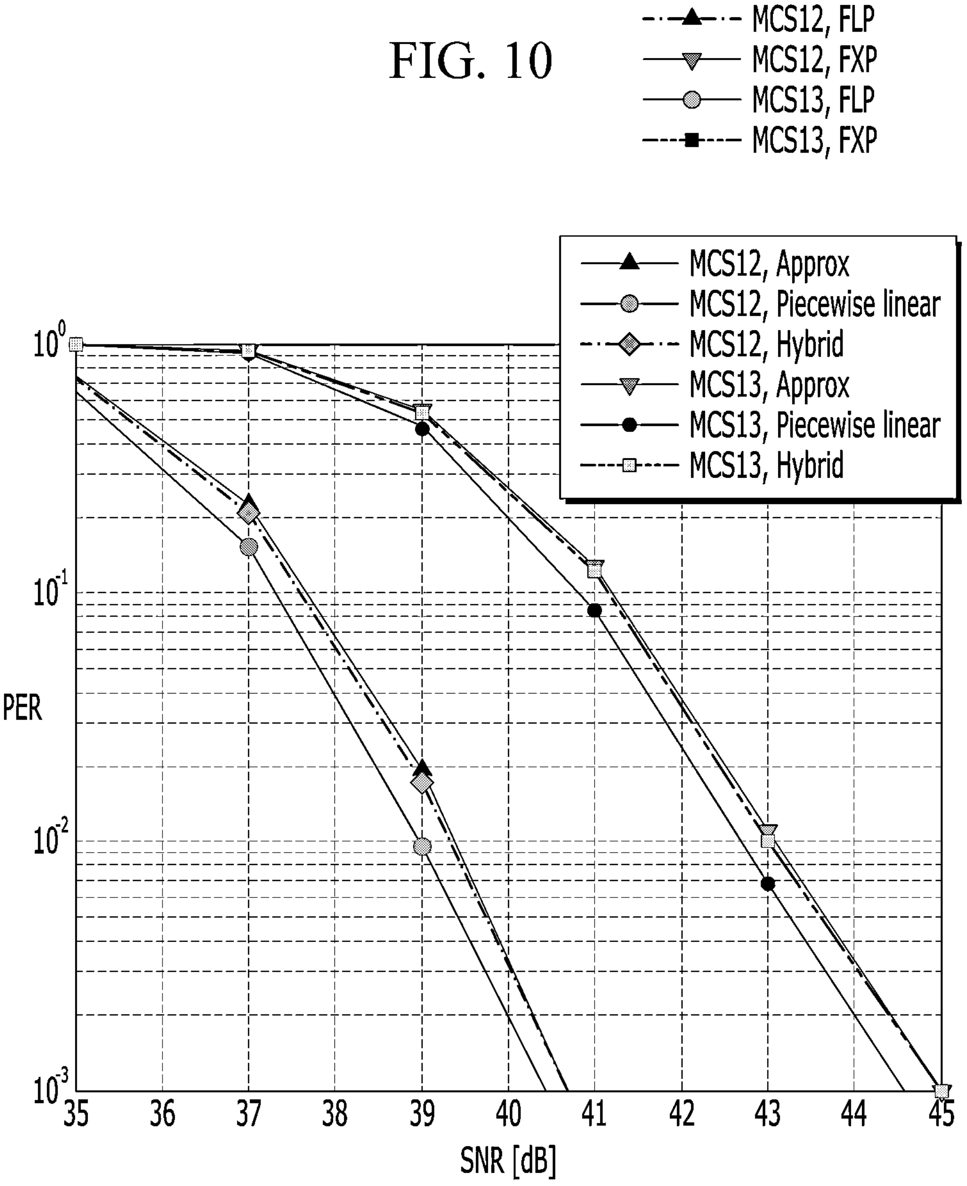
FIG. 10 is a drawing schematically showing reception PER performance in a communication system according to an embodiment.

FIG. 10 is a drawing schematically showing reception PER performance in a communication system according to an embodiment.

FIG. 10 shows the case that the demapper 231 (refer to FIG. 2) according to an embodiment derives the LLR by using the approximation function, piecewise linear function, and hybrid function. The communication system used EHT packets using Channel D, frequency offset of 20 ppm, and 4096-QAM of 1×1 BW 160 MHz. In addition, the first state data with 22 bits and the second state data with 21 bits were used as inputs to the demapper 231 in order to support 4096-QAM.

In more detail, the demapper 231 may use the FLP C model. In addition, the demapper 231 may use the MCS12 method or MCS13 method.

In MCS12, when the approximation function and the hybrid function are used, each may have similar SNR performances according to PER, and when the piecewise linear function is used, the SNR may be lower by about 0.2-0.5 dB than the case of using the approximation function and the hybrid function.

In MCS13, when the approximation function and the hybrid function are used, each may have similar SNR performances according to PER, and when the piecewise linear function is used, the SNR may be lower than by about 0.2-0.3 dB than the case of using the approximation function and the hybrid function.

As shown in FIG. 10, when the approximation function and the hybrid function are used, for $10^{-1}$ PER, the SNR has 37.6 dB in MCS12, and the SNR is 41.2 dB in MCS13, which show almost similar performance. Meanwhile, when the piecewise linear function is used, the SNR has 37.3 dB in MCS12, and the SNR may have 40.8 dB in MCS13. For example, when the piecewise linear function is used, the SNR may be lower by about 0.3-0.4 dB at $10^{-1}$ PER compared to the case of using the approximation function or using the hybrid function.

Table 7 shows power, performance, and area (PPA) for the approximation function, the hybrid function, and the piecewise linear function model.

TABLE 7

| | | Performance | | |
|---|---|---|---|---|
| | Power | MCS 12 | MCS 13 | Area |
| Approximated function | 204 uW | 37.6 dB | 41.2 dB | 5.2 Kgates |
| Hybrid function | 598 uW | 37.6 dB | 41.2 dB | 11.4 Kgates |
| Piecewise linear function | 1510 uW | 37.3 dB | 40.8 dB | 22.2 Kgates |

When the approximation function and the hybrid function are used, less electrical power may be used and smaller area may be occupied compared to when the piecewise linear function is used. Meanwhile, when the piecewise linear function used, better performance (i.e., lower SNR) may be obtained compared to when the approximation function is used or when the hybrid function is used. Accordingly, the demapper 231 may derive the LLR by using the approximation function when priority is given to power and area, and by using the partial linear function when priority is given to performance.

Meanwhile, rather than selecting an algorithm used by the demapper 231 by comparing only the PPA used by the demapper 231, an algorithm used by the demapper 231 may be selected by considering the PPA of the entire communication system 10. For example, when the supported bandwidth is low and the number of antennas in the receiver is small, it may be appropriate for the demapper 231 to use an approximate function model in a physical interface transceiver (PHY) for low power. On the other hand, in the PHY that has a high supported bandwidth and requires high throughput to support multiple-input multiple-output (MIMO), it may be appropriate for the demapper 231 to use a partially linear function model.

Figure 11:
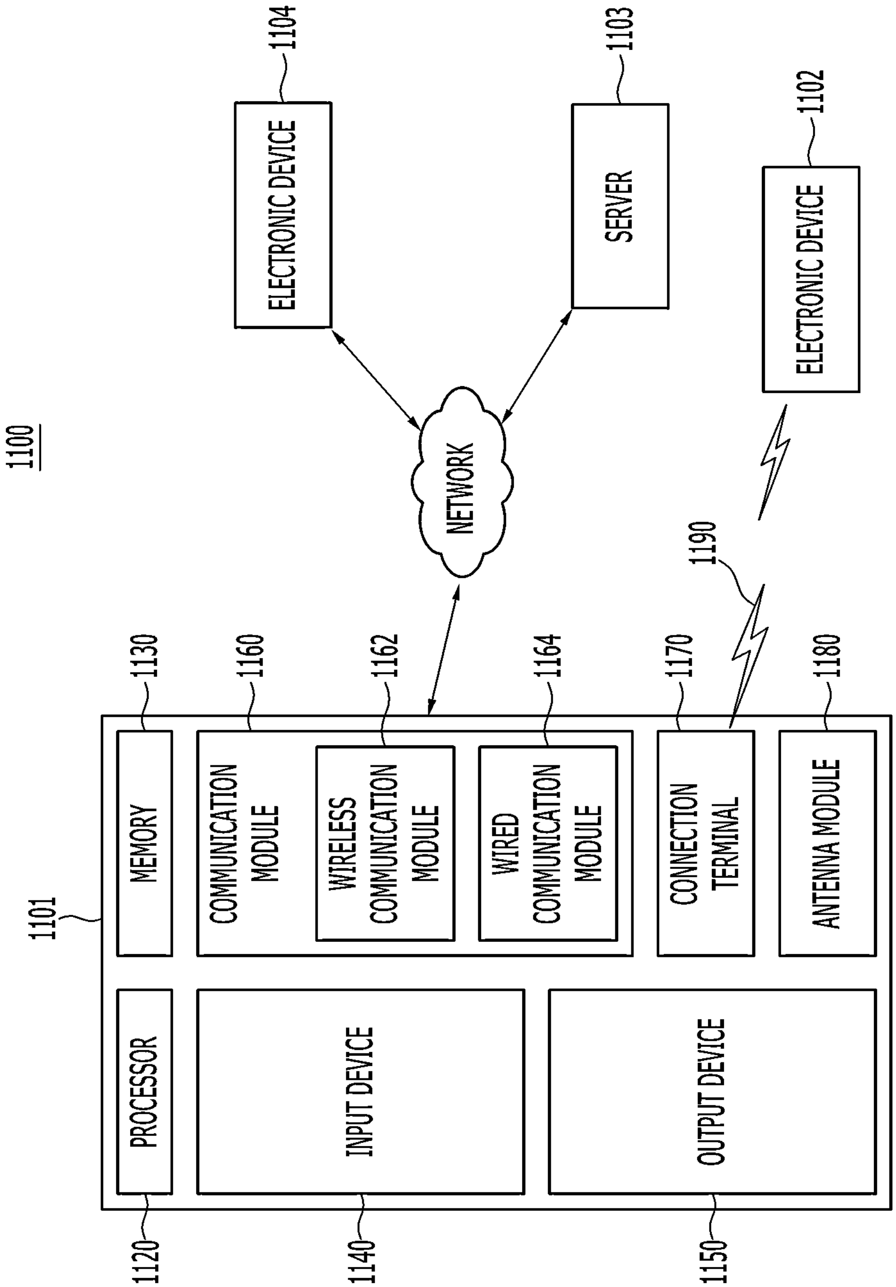
FIG. 11 is a block diagram showing an electronic device in a network environment according to an embodiment.

FIG. 11 is a block diagram showing an electronic device in a network environment according to an embodiment.

Referring to FIG. 11, an electronic device 1101 of a network environment 1100 may communicate with an electronic device 1102 through a first network 1190 (e.g., short range wireless communication network) or an electronic device 1104 or a server 1103 through a second network 1199 (e.g., long range wireless communication network). In an embodiment, each of the first network 1190 and the second network 1199 may correspond to the channel 150 of FIGS. 1 and 2. The electronic device 1101 may communicate with the electronic device 1104 through the server 1103. The electronic device 1101 may include a processor 1120, a memory 1130, an input device 1140, an output device 1150, a communication module 1160, a connection terminal 1170, and an antenna module 1180. In an embodiment, at least one component may be omitted in the electronic device 1101 or one or more other components may be added to the electronic device 1101. In an embodiment, some components may be implemented as a single integrated circuit (IC).

The processor 1120 may perform processing or calculation of various data, by executing software to control at least one other component (e.g., hardware or software component) of the electronic device 1101 connected to the processor 1120. As part of processing or calculating data, the processor 1120 may load instructions or data received from other components (e.g., the communication module 1160) into the memory 1130, process the instructions or data stored in the memory 1130, and store the resulting data into the memory 1130. The processor 1120 may include central processing unit (CPU), application processor (AP), GPU, image signal processor (ISP), sensor hub processor, or communication processor (CP).

The memory 1130 may store various data used by at least one component (e.g., the processor 1120) of the electronic device 1101. The various data may include, for example, input data or output data for software and related instructions. The memory 1130 may include volatile memory or non-volatile memory.

The input device 1140 may receive instructions or data to be used by other components (e.g., the processor 1120) of the electronic device 1101 from the exterior (e.g., a user) of the electronic device 1101. The Input device 1140 may include a microphone, a mouse, or a keyboard.

The output device 1150 may output data processed by the processor 1120 to the exterior of the electronic device 1101.

For example, the output device 1150 may include an audio output device, a display device, and the like. The sound output device may output acoustic signals to the exterior of the electronic device 1101. The output device 1150 may include for example, a speaker or receiver. The acoustic output device 1150 may include for example, a speaker or receiver. The speaker may be used for general purposes such as multimedia playback or recording, and the receiver may be used to receive incoming calls. In an embodiment, the receiver may be separate from the speaker or implemented as part of the speaker.

A display device 760 may visually provide information to the exterior (e.g., user) of the electronic device 1101. The display device 760 may include, for example, a display, a hologram device, or a projector, and a corresponding control circuit to control the display, the hologram device, or the projector. In an embodiment, the display device 760 may include a touch circuit configured to detect a touch, or a sensor circuit (e.g., a pressure sensor) configured to measure the intensity of force generated by the touch.

The connection terminal 1170 may include a connector through which the electronic device 1101 may be physically connected to the external electronic device 1102. In an embodiment, the connection terminal 1170 may include an HDMI connector, a USB connector, an SD card connector, or an audio connector (e.g., headphone connector).

The communication module 1160 may support to establish a direct (wired) communication channel or a wireless communication channel between the electronic device 1101 and the external electronic device (e.g., the electronic device 1102, the electronic device 1104 or the server 1103), and communication may be performed through the established communication channel. The communication module 1160 may include one or more communication processors that operate independently of processor 1120 (e.g., AP) and support direct (wired) communication or wireless communication. In an embodiment, the communication module 1160 may include a wireless communication module 1162 (e.g., cellular communication module, short range wireless communication module or global navigation satellite system (GNSS) communication module) or wired communication module 1164 (e.g., local area network (LAN) communication module or electrical line communication (PLC) module). Theses communication modules may communicate with an external electronic device through the first network 1190 (e.g., a short-range communication network such as Bluetooth, Wi-Fi Direct or infrared data association (IrDA)) or the second network 1199 (e.g., a long-range communication network such as cellular network, Internet or computer network (e.g., LAN, WAN)). These various types of communication modules may be implemented as a single component (e.g., a single IC) or may be implemented as a plurality of components (e.g., multiple ICs) separated from each other. The wireless communication module 1162 may identify and authenticate the electronic device 1101 in a communication network such as the first network 1190 or the second network 1199.

The antenna module 1180 may transmit and receive signals or electrical power to and from the exterior (e.g., an external electronic device) of the electronic device 1101. In an embodiment, the antenna module 1180 may include one or more antenna, from which at least one antenna appropriate for the communication scheme used in a communication network such as the first network 1190 or the second network 1199 may be selected. Thereafter, signals or electrical power may be transmitted or received between the communication module 1160 and an external electronic device through the selected at least one antenna.

The communication module 1160 may be implemented as a communication system including the demapper described with reference to FIG. 3 to FIG. 8. In an embodiment, the communication module 1160 may not perform a division operation in mapping the reception signal. In addition, the communication module 1160 may map signals according to all modulation types, such as existing BPSK, 256-QAM, and 1024-QAM, as well as 4096-QAM. The communication module 1160 may map the reception signal by using a piecewise linear function, an approximation function, or a hybrid function combining a piecewise linear function and an approximation function. For example, in the case of the electronic device 1101 where the power consumed by the communication module 1160 and the area occupied by the communication module 1160 are important, the reception signal may be mapped by using an approximation function. For still another example, in the case of the electronic device 1101 where it is important to accurately decode the signal received by the communication module 1160, the reception signal may be mapped by using a piecewise linear function. Accordingly, the time required for the electronic device 1101 to obtain the LLR may be reduced.

At least some of the aforementioned components may be combined with each other, and may transfer signals (e.g., commands or data) through a communication scheme (e.g., bus, general purpose input and output (GPIO), serial peripheral interface (SPI), mobile industry processor interface (MIPI)) between peripheral devices.

In an embodiment, instruction or data may be transmitted or received between the electronic device 1101 and the external electronic device 1104 through the server 1103 connected to the second network 1199. Each of the electronic devices 1102 and 1104 may be the same type as or a different type from the electronic device 1101. All or part of operations to be executed in the electronic device 1101 may be executed in one or more of the external electronic devices 1102 and 1104. For example, if the electronic device 1101 must perform a function or service automatically or in response to a request from a user or another device, the electronic device 1101 may request one or more external electronic device to perform a part of the function or service, instead of or in addition to performing the function or service directly. One or more external electronic devices that have received the request may perform at least part of the requested function or service or an additional function or additional service related to the request, and transfer the performance result to the electronic device 1101. The electronic device 1101 may provide the result with or without further processing as at least part of a response to the request. To this end, for example, cloud computing, distributed computing or client-server computing technologies may be used.

In an embodiment, each component (e.g., module or program) of the above-described components may include a single body or multiple bodies. One or more of the above-described components may be omitted, or one or more other components may be added. Alternatively or additionally, multiple components (e.g., modules or programs) may be integrated into a single component. In this case, the integrated component may still perform the function of each of the plurality of components in the same or similar manner as that performed by the corresponding one of the plurality of components prior to integration. The operations performed by a module, program, or other component may be performed sequentially, in parallel, iteratively, or heuristically, one or more operations may be executed in a different order or omitted, and one or more other operations may be added.

Although the embodiments of the present invention have been described in detail above, the scope of the present invention is not limited thereto, and various modifications and improvements of those skilled in the art using the basic concept of the present invention defined in the following claims are also included in the scope of the present invention that fall within the scope of the right.

What is claimed is:

1. An apparatus for transmitting and receiving signal, the apparatus comprising:

a transceiver configured to receive a reception signal through a channel and demodulate the reception signal into a reception symbol and a channel estimation value corresponding to the reception signal; and a demapper configured to:

detect a modulation type of the reception signal, calculate a first status data based on a first value obtained by zero-forcing the reception symbol and a second value obtained by squaring the channel estimation value, calculate a second status data based on the second value, and estimate bit information with respect to the reception symbol based on the modulation type, the first status data, and the second status data, wherein:

the bit information comprises a log likelihood ratio (LLR) signal of n bits, the LLR signal comprises a plurality of first bits representing a real part and a plurality of second bits representing an imaginary part, and the demapper comprises an LLR calculator configured to determine the LLR signal by using a piecewise linear function representing the reception symbol as a plurality of linear functions by dividing the reception symbol into a plurality of sections and approximating each of the plurality of sections by a linear function.

2. The apparatus of claim 1, wherein:

the LLR calculator is further configured to determine the LLR signal by using an approximation function that approximates the reception symbol with respect to each of the plurality of first bits and the plurality of second bits.

3. The apparatus of claim 2, wherein:

the LLR calculator comprises a plurality of selectors configured to output one of an absolute value of the first status data and outputs of a plurality of calculation units based on the modulation type, each of the plurality of calculation units comprises an absolute value detector and an adder connected to the absolute value detector and is configured to subtract an output of the absolute value detector from a value obtained by multiplying the second status data and a corresponding one among a plurality of constants, a first absolute value detector of a first calculation unit among the plurality of calculation units is configured to receive the first status data, and a corresponding one among the plurality of selectors is configured to output a signal to the absolute value detector of a remaining calculation unit excluding the first calculation unit from the plurality of calculation units.

4. The apparatus of claim 3, wherein:

the plurality of calculation units includes the first calculation unit and second to fifth calculation units, the first calculation unit corresponds to a first constant of $2^5$, the second calculation unit corresponds to a second constant of $2^4$, the third calculation unit corresponds to a third constant of $2^3$, the fourth calculation unit corresponds to a fourth constant of $2^2$, and the fifth calculation unit corresponds to a fifth constant of $2^1$.

5. The apparatus of claim 4, wherein the LLR calculator is configured to determine the LLR signal based on outputs of the first to fifth calculation units.

6. The apparatus of claim 4, wherein the LLR calculator further comprises:

a lookup table containing mapping of outputs of the first to fifth calculation units to each of the plurality of first bits or each of the plurality of second bits depending on the modulation type.

7. The apparatus of claim 1, wherein the LLR calculator comprises:

a slicer configured to detect a section corresponding to the reception symbol based on the first status data and the second status data;

a coefficient lookup table storing information about a first coefficient corresponding to the first status data and a second coefficient corresponding to the second status data depending on the section;

a first multiplier configured to generate a first output by multiplying the second status data and the second coefficient;

a first adder configured to generate a second output by adding the first output and the first status data; and a second multiplier configured to determine the LLR signal by multiplying the second output and the first coefficient.

8. The apparatus of claim 7, wherein:

the slicer comprises:

an absolute value detector configured to receive the first status data;

a clipper configured to receive an output of the absolute value detector and clip the output of the absolute value detector based on the modulation type and the second status data; and a plurality of calculation units, each of the plurality of calculation units comprises:

an adder configured to subtract a value obtained by multiplying the second status data and a corresponding one among a plurality of constants from a corresponding input; and a selector connected to the adder and configured to output one of the corresponding input and an output of the adder based on a sign of the output of the adder, a first adder of a first calculation unit among the plurality of calculation units connected to the clipper is configured to receive an output of the clipper, a first selector of the first calculation unit is configured to output one of the output of the first adder and the output of the clipper, and a corresponding selector of the plurality of calculation units is configured to output a signal to an adder of a remaining calculation unit excluding the first calculation unit from the plurality of calculation units.

9. The apparatus of claim 8, wherein:

the plurality of calculation units includes the first calculation unit and second to fourth calculation units, the first calculation unit corresponds to a first constant of $2^5$, the second calculation unit corresponds to a second constant of $2^4$, the third calculation unit corresponds to a third constant of $2^3$, the fourth calculation unit corresponds to a fourth constant of $2^2$, and the slicer further comprises a fifth adder connected to an output of the fourth calculation unit, and the fifth adder configured to subtract a value obtained by multiplying $2^1$ and the second status data from the output of the fourth calculation unit.

10. The apparatus of claim 1, wherein the LLR calculator comprises:

a slicer configured to detect a section corresponding to the reception symbol based on the first status data and the second status data;

a coefficient lookup table storing information about a first coefficient corresponding to the first status data and a second coefficient corresponding to the second status data depending on the section;

a first multiplier configured to generate a first output by multiplying the first coefficient and the first status data;

a second multiplier configured to generate a second output by multiplying the second status data and the second coefficient; and a first adder configured to determine the LLR signal by adding the first output and the second output.

11. The apparatus of claim 1, wherein:

the LLR signal is determined by using an approximation function that approximates the reception symbol with respect to a portion of the plurality of first bits and a portion of the plurality of second bits, and the LLR signal is determined by using the piecewise linear function that approximates the reception symbol with respect to a remaining first bit excluding the portion of the plurality of first bits and a remaining second bit excluding the portion of the plurality of second bits.

12. The apparatus of claim 1, wherein:

the first status data is $Z \cdot A|H|^2$, wherein Z is a result of zero-forcing the reception symbol, A is a normalization constant, and His the channel estimation value of the channel, and the second status data is a $A \cdot A|H|^2$.

13. An operation method of an apparatus for transmitting and receiving signal, the operation method comprising:

receiving a reception signal through a channel and demodulating the reception signal into a reception symbol and a channel estimation value corresponding to the reception signal;

detecting a modulation type of the reception signal;

calculating a first status data based on a first value obtained by zero-forcing the reception symbol and a second value obtained by squaring the channel estimation value;

calculating a second status data based on the second value;

estimating bit information with respect to the reception symbol based on the modulation type, the first status data, and the second status data; and performing decryption on the bit information, wherein the estimating of the bit information comprises:

determining a log likelihood ratio (LLR) signal, which comprises a plurality of first bits representing a real part and a plurality of second bits representing an imaginary part, by using a piecewise linear function representing the reception symbol as a plurality of linear functions by dividing the reception symbol into a plurality of sections and approximating each of the plurality of sections by a linear function.

14. The operation method of claim 13, wherein the estimating of the bit information further comprises:

determining the LLR signal by using an approximation function that approximates the reception symbol with respect to each of the plurality of first bits and the plurality of second bits.

15. The operation method of claim 13, wherein the estimating of the bit information further comprises:

determining the LLR signal by using an approximation function that approximates the reception symbol with respect to a portion of the plurality of first bits and a portion of the plurality of second bits; and determining the LLR signal by using the piecewise linear function with respect to a remaining first bit excluding the portion of the plurality of first bits and a remaining second bit excluding the portion of the plurality of second bits.

16. An apparatus for transmitting and receiving signal, the apparatus comprising:

a transceiver configured to receive a reception signal through a channel and demodulate the reception signal into a reception symbol and a channel estimation value corresponding to the reception signal;

a status data calculator configured to detect a modulation type of the signal, calculate a first status data based on a first value obtained by zero-forcing the reception symbol and a second value obtained by squaring the channel estimation value, and calculate a second status data based on the second value;

an LLR calculator configured to estimate a log likelihood ratio (LLR) signal of n bits comprising a plurality of first bits representing a real part and a plurality of second bits representing an imaginary part with respect to the reception symbol based on the modulation type, the first status data, and the second status data; and a lookup table storing a mapping relationship between the reception symbol and the plurality of first bits or the plurality of second bits depending on the modulation type, wherein the LLR calculator is further configured to determine the LLR signal by using a piecewise linear function representing the reception symbol as a plurality of linear functions by dividing the reception symbol into a plurality of sections and approximating each of the plurality of sections by a linear function.

17. The apparatus of claim 16, wherein:

the LLR calculator is configured to further determine the LLR signal by using an approximation function that approximates the reception symbol with respect to each of the plurality of first bits and the plurality of second bits, the LLR calculator comprises a plurality of selectors configured to output one of an absolute value of the first status data and outputs of a plurality of calculation units based on the modulation type, each of the plurality of calculation units comprises an absolute value detector and an adder connected to the absolute value detector and is configured to subtract an output of the absolute value detector from a value obtained by multiplying the second status data and a corresponding one among a plurality of constants, a first absolute value detector of a first calculation unit among the plurality of calculation units is configured to receive the first status data, and a corresponding one among the plurality of selectors is configured to output a signal to the absolute value detector of a remaining calculation unit excluding the first calculation unit from the plurality of calculation units.

18. The apparatus of claim 16, wherein:

the LLR calculator comprises:

a slicer configured to detect a section corresponding to the reception symbol based on the first status data and the second status data;

a coefficient lookup table storing information about a first coefficient corresponding to the first status data and a second coefficient corresponding to the second status data depending on the section;

a first multiplier configured to generate a first output by multiplying the second status data and the second coefficient;

a first adder configured to generate a second output by adding the first output and the first status data; and a second multiplier configured to determine the LLR signal by multiplying the second output and the first coefficient.

* * * * *